United States Patent
Niwa et al.

(10) Patent No.: US 7,929,716 B2
(45) Date of Patent: Apr. 19, 2011

(54) VOLTAGE SUPPLY CIRCUIT, POWER SUPPLY CIRCUIT, MICROPHONE UNIT USING THE SAME, AND MICROPHONE UNIT SENSITIVITY ADJUSTMENT METHOD

(75) Inventors: Fumiyuki Niwa, Shiga (JP); Hiroshige Kinoshita, Kanagawa (JP); Masayuki Ida, Shiga (JP)

(73) Assignee: Renesas Electronics Corporation, Kanagawa (JP)

(*) Notice: Subject to any disclaimer, the term of this patent is extended or adjusted under 35 U.S.C. 154(b) by 1502 days.

(21) Appl. No.: 11/325,303

(22) Filed: Jan. 5, 2006

(65) Prior Publication Data
US 2006/0147061 A1 Jul. 6, 2006

(30) Foreign Application Priority Data

Jan. 6, 2005 (JP) ................. 2005-001380
Sep. 29, 2005 (JP) ................. 2005-285002

(51) Int. Cl.
*H04R 3/00* (2006.01)
(52) U.S. Cl. ......... 381/113; 381/111; 381/120; 381/122
(58) Field of Classification Search .............. 381/95, 381/120, 122, 111–115; 330/250, 259, 270, 330/290, 261, 297; 379/395
See application file for complete search history.

(56) References Cited

U.S. PATENT DOCUMENTS

| 4,617,555 A * | 10/1986 | Sheiman ........................ 340/531 |
| 5,036,536 A * | 7/1991 | Hanon et al. ................... 379/395 |
| 5,239,579 A * | 8/1993 | Schuh ........................... 379/395 |
| 6,195,437 B1 * | 2/2001 | Markow et al. ................. 381/93 |
| 7,003,127 B1 * | 2/2006 | Sjursen et al. ................. 381/322 |
| 7,372,967 B2 * | 5/2008 | Henson et al. ................. 381/111 |
| 7,391,873 B2 * | 6/2008 | Deruginsky et al. .......... 381/113 |
| 7,634,096 B2 * | 12/2009 | Fallesen ........................ 381/113 |
| 7,756,279 B2 * | 7/2010 | Deruginsky et al. ........... 381/95 |
| 2006/0008097 A1 * | 1/2006 | Stenberg et al. ............. 381/113 |
| 2008/0002841 A1 * | 1/2008 | Baker et al. .................. 381/113 |

FOREIGN PATENT DOCUMENTS

JP 2004-133800 A 4/2004

OTHER PUBLICATIONS

Kougakutosho Ltd. "PA AUDIO-COMMUNICATION SYSTEM," 1996.

* cited by examiner

*Primary Examiner* — Vivian Chin
*Assistant Examiner* — Jason R Kurr
(74) *Attorney, Agent, or Firm* — Sughrue Mion, PLLC

(57) ABSTRACT

A voltage supply circuit includes a power supply booster, an amplifier operating with a voltage generated by the power supply booster as a power supply voltage and supplying a bias voltage to a sensor, and an output voltage setting part including a feedback resistor for the amplifier. The feedback resistor has resistance determined according to a set value of a bias voltage of the sensor.

25 Claims, 20 Drawing Sheets

| DATA CONTENTS | DATA | 1 | 2 | 3 | 4 | 5 | 6 | 7 |
|---|---|---|---|---|---|---|---|---|
| SETTINGS IN NORMAL OPERATION | V1 OPERATION | 0 | 0 | 0 | 0 | 0 | 0 | 0 |
| SETTINGS IN NORMAL OPERATION | V2 OPERATION | 1 | 0 | 0 | 0 | 0 | 0 | 0 |
| SETTINGS ONLY IN VOLTAGE ADJUSTMENT | V1+3V SETTING | 0 | 1 | 0 | 0 | 0 | 0 | 0 |
| | V1+2V SETTING | 0 | 0 | 1 | 0 | 0 | 0 | 0 |
| | V1+1V SETTING | 0 | 1 | 1 | 0 | 0 | 0 | 0 |
| | V1 SETTING | 0 | 0 | 0 | 1 | 0 | 0 | 0 |
| | V1-1V SETTING | 0 | 1 | 0 | 1 | 0 | 0 | 0 |
| | V1-2V SETTING | 0 | 0 | 1 | 1 | 0 | 0 | 0 |
| | V1-3V SETTING | 0 | 1 | 1 | 1 | 0 | 0 | 0 |
| | V2+3V SETTING | 1 | 0 | 0 | 0 | 0 | 0 | 1 |
| | V2+2V SETTING | 1 | 0 | 0 | 0 | 1 | 0 | 1 |
| | V2+1V SETTING | 1 | 0 | 0 | 0 | 0 | 1 | 1 |
| | V2 SETTING | 1 | 0 | 0 | 0 | 1 | 1 | 1 |
| | V2-1V SETTING | 1 | 0 | 0 | 0 | 0 | 0 | 1 |
| | V2-2V SETTING | 1 | 0 | 0 | 0 | 1 | 0 | 1 |
| | V2-3V SETTING | 1 | 0 | 0 | 0 | 1 | 1 | 1 |

HIGH SENSITIVITY VOLTAGE INITIAL VALUE V1(V); e.g. 24V
LOW SENSITIVITY VOLTAGE INITIAL VALUE V2(V); e.g. 12V

→ SWITCHING BY 1V STEP THIS VOLTAGE CAN BE VARIED ARBITRARILY BY THE NUMBER OF BITS OF DATA PROCESSING SIGNAL

Fig. 5

VOLTAGE SUPPLY CIRCUIT, POWER SUPPLY CIRCUIT, MICROPHONE UNIT USING THE SAME, AND MICROPHONE UNIT SENSITIVITY ADJUSTMENT METHOD

BACKGROUND OF THE INVENTION

1. Field of the Invention

The present invention relates to voltage supply circuits and, particularly, to a voltage supply circuit for supplying a voltage to a sensor such as a capacitor microphone, a microphone unit using the same, and a method of adjusting the sensitivity of the microphone unit.

2. Description of Related Art

Technology that uses a microphone called a capacitor microphone for audio communication in mobile terminals such as cell phones is widely used. The capacitor microphone is a microphone which is formed of a capacitor whose one electrode is a diaphragm and which perceives the vibration of a sound or the like as a change in capacitance and converts it into an electric signal.

"PA Audio-communication System" (Kougakutosho Ltd., 1996) describes a normal capacitor microphone system. FIG. 20 shows a circuit of a capacitor microphone unit 100 that uses the capacitor microphone. As shown in FIG. 20, the conventional capacitor microphone unit includes a capacitor microphone 101, a junction field-effect transistor (JFET) 102, a capacitor 103, resistors 104 and 105, and DC power supplies 106 and 108.

The capacitor microphone 101 is a vibration sensor that receives a sound pressure such as a sound and generates an output signal. One electrode of the capacitor microphone 101 is connected to the DC power supply 108 through the resistor 104, and the other electrode is grounded. The capacitor microphone 101 receives a specific bias voltage from the DC power supply 108. The output terminal of the capacitor microphone 101 is connected to the gate of the JFET 102. The JFET 102 is an amplifier that amplifies an output signal from the capacitor microphone 101 and generates an amplified signal. The amplified signal generated in the JFET 102 is output from the capacitor microphone unit 100 through an output terminal 107.

Though the capacitor microphone unit 100 shown in FIG. 20 uses two DC power supplies 106 and 108, it is feasible to boost the voltage supplied from the DC power supply 106 to generate a bias voltage to be supplied to the capacitor microphone 101.

In such a capacitor microphone unit, manufacturing variation can occur in the manufacture of a capacitor microphone and JFET. The manufacturing variation leads to variation in distance between capacitor electrodes and variation in amplification efficiency of JFET, causing capacitor microphone units to have different sensitivities.

Therefore, there has been a need for a capacitor microphone unit that can operate with an appropriate sensitivity even if manufacturing variation occurs in a sensor device such as a capacitor microphone.

Further, conventional techniques change the sensitivity of a capacitor microphone unit by preparing two capacitor microphone units with different sensitivity settings and switching the capacitor microphone units themselves. In this configuration, it is necessary to prepare the same number of capacitor microphone units as the number of sensitivity levels to be switched. Therefore, there has been a need for a capacitor microphone unit that allows selection between a plurality of sensitivity levels in one unit.

SUMMARY OF THE INVENTION

According to an aspect of the present invention, there is provided a voltage supply circuit that includes a power supply booster, an amplifier operating with a voltage generated by the power supply booster as a power supply voltage and supplying a bias voltage to a sensor, and an output voltage setting part including a feedback resistor for the amplifier, the feedback resistor having resistance determined according to a set value of a bias voltage of the sensor.

This configuration enables to select a bias voltage to be supplied to a sensor such as a capacitor microphone.

According to another aspect of the present invention, there is provided a microphone unit that includes a microphone receiving a bias voltage, a power supply booster, an amplifier operating with a voltage generated by the power supply booster as a power supply voltage and supplying a bias voltage to the microphone, and an output voltage setting part including a feedback resistor for the amplifier, the feedback resistor having resistance determined according to a set value of a bias voltage of the microphone.

This configuration enables to reduce variation in sensitivity of a microphone unit.

According to yet another aspect of the present invention, there is provided a method of adjusting a sensitivity of a microphone, which includes inputting a reference tone to a microphone, comparing an output of the microphone for the reference tone with a reference voltage, outputting a set value for setting a bias voltage to be biased to the microphone based on a comparison result, and storing the set value and determining a feedback resistance value of an amplifier for outputting the bias voltage based on the set value.

This sensitivity adjustment operation enables to reduce variation in sensitivity of a microphone unit.

BRIEF DESCRIPTION OF THE DRAWINGS

The above and other objects, advantages and features of the present invention will be more apparent from the following description taken in conjunction with the accompanying drawings, in which:

FIG. 5 is a view showing a set value output from an adjustment signal generator and an amount to adjust a bias voltage;

DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

The following embodiments take a capacitor microphone unit as an example of a microphone unit.

First Embodiment

Figure 1:
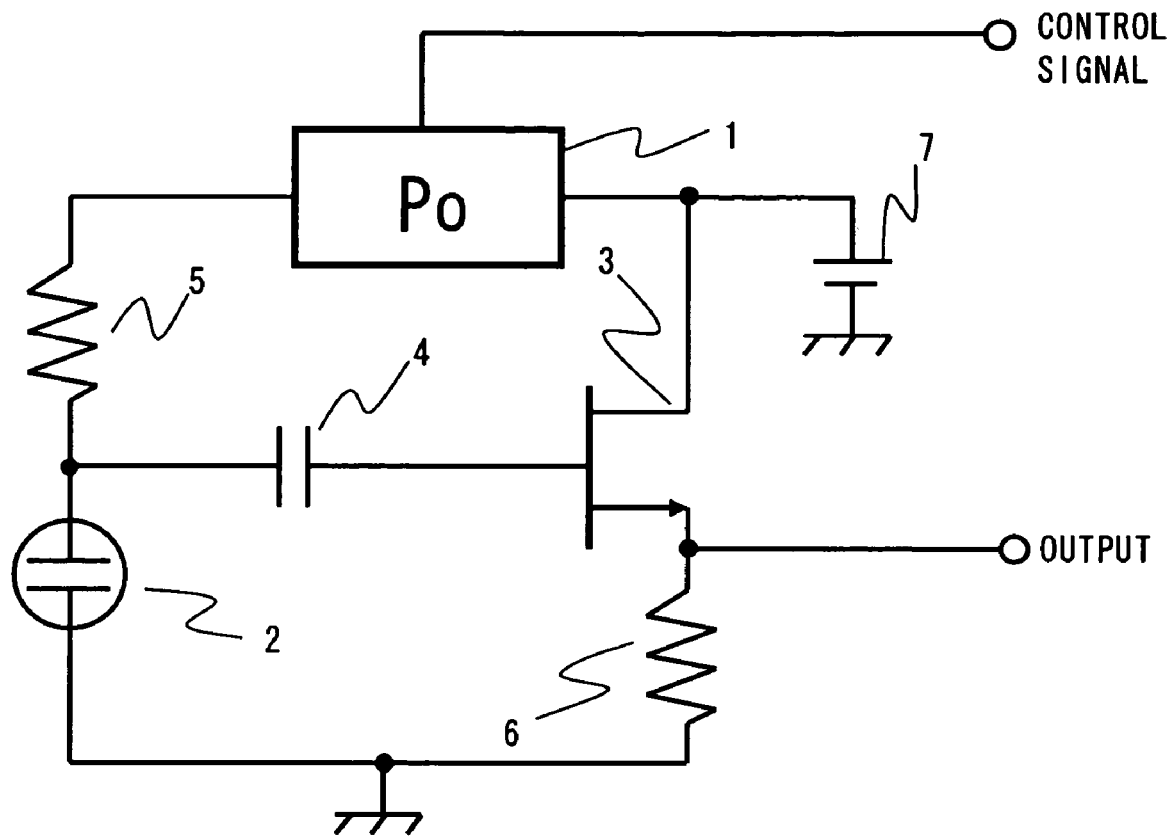
FIG. 1 is a view showing a capacitor microphone unit of the present invention.

FIG. 1 is a view showing a capacitor microphone unit according to a first embodiment of the present invention. The capacitor microphone unit of the first embodiment includes a voltage supply circuit 1, a capacitor microphone 2, an amplifier 3, a capacitor 4, resistors 5 and 6, and a power supply 7.

The voltage supply circuit 1 boosts the voltage from the power supply 7 and supplies a bias voltage to the capacitor microphone 2. The bias voltage is supplied to the capacitor microphone 2 through the resistor 5. The bias voltage output from the voltage supply circuit 1 is detailed later. The capacitor microphone 2 is a microphone element (vibration sensor) whose one electrode is a diaphragm. The amplifier 3 is a junction field-effect transistor (JFET) that receives the output of the capacitor microphone 2 at its gate. The JFET 3 is connected between the power supply 7 and the ground.

In this capacitor microphone unit, the diaphragm of the capacitor microphone 2, which is a vibration sensor, vibrates in response to a sound or the like. Since capacitance changes when the diaphragm vibrates, a charge stored in the capacitor microphone 2 changes accordingly. Based on the change in the charge, the voltage of the node between the resistor 5 and the capacitor microphone 2 changes. The change in the voltage is supplied as an output signal of the capacitor microphone 2 to the gate electrode of the JFET 3 through the capacitor 4. The JFET 3 amplifies the output signal from the capacitor microphone 2 and outputs it as an output signal of the capacitor microphone unit from the node between the source of the JFET 3 and the resistor 6.

The capacitor 4 cuts the DC component of a voltage to be supplied to the gate of the JFET 3. The resistor 5 matches impedance with the gate of the JFET 3.

The capacitor microphone unit of the first embodiment has a high sensitive mode and a low sensitive mode. In the high sensitive mode, a first bias voltage (e.g. about 24V) is applied to the capacitor microphone 2; in the low sensitive mode, a second bias voltage (e.g. about 12V) is applied thereto. A mode specifying signal for setting the mode is supplied from outside to the voltage supply circuit 1 during the operation of the capacitor microphone unit. The voltage supply circuit 1 applies the first or the second bias voltage to the capacitor microphone 2 according to the mode specifying signal.

In the series of operation, a basic voltage that is supplied from the voltage supply circuit 1 to the capacitor microphone 2 is determined by the mode specifying signal. However, as described earlier, manufacturing variation occurs in the capacitor microphone unit. Thus, the voltage supply circuit 1 of the first embodiment is configured to be capable of adjustment of the first and the second bias voltage by sensitivity adjustment performed beforehand as described later. The voltage supply circuit 1 is described herein.

Figure 2:
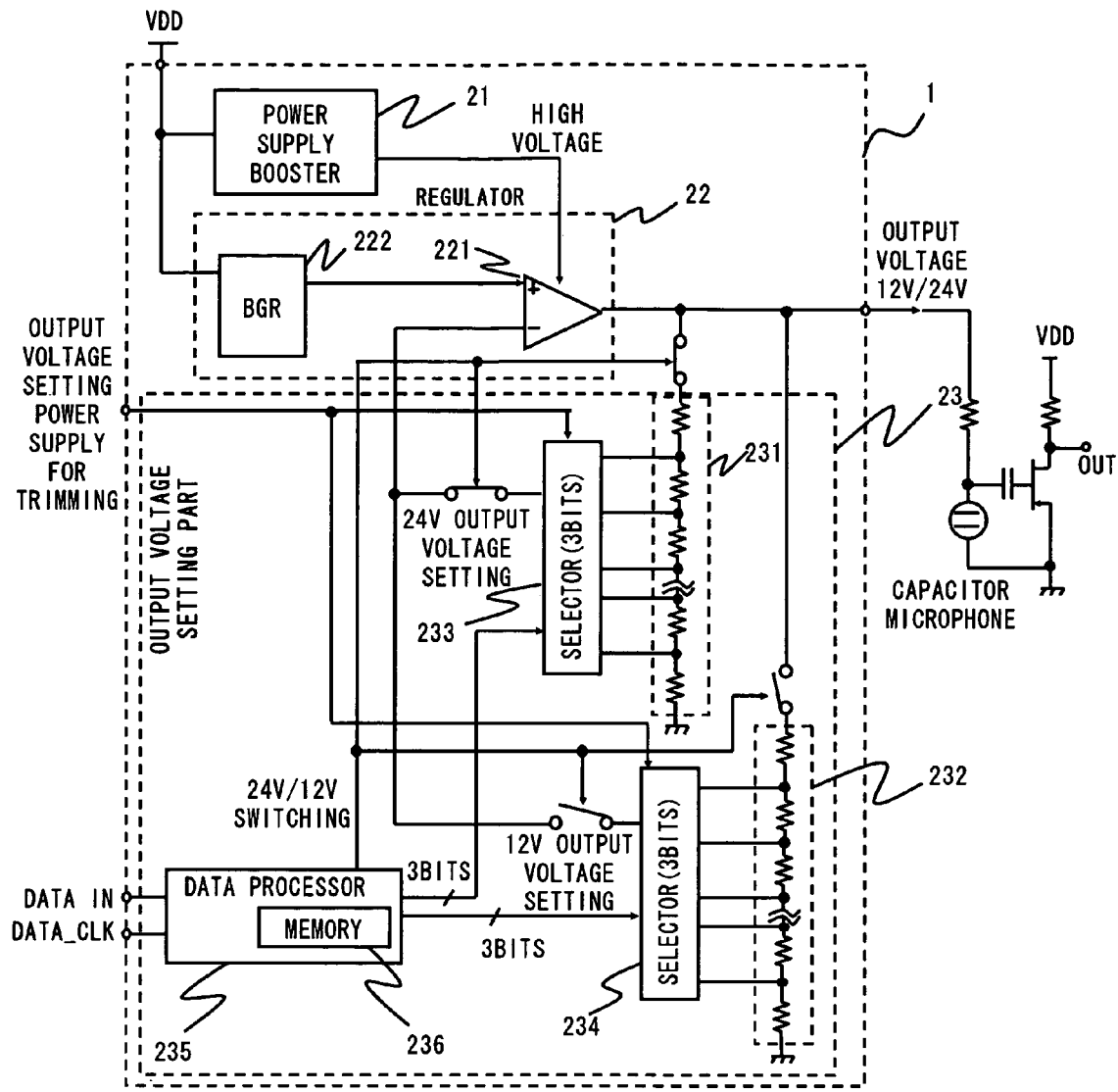
FIG. 2 is a view showing a voltage supply circuit of a capacitor microphone unit according to a first embodiment of the invention.

FIG. 2 is a block diagram showing the configuration of the voltage supply circuit 1 of the first embodiment. The voltage supply circuit 1 of the first embodiment includes a power supply booster 21, a regulator 22, and an output voltage setting part 23.

The power supply booster 21 boosts a voltage (e.g. 5V) supplied from the power supply 7 to a necessary voltage level (e.g. about 24V) and outputs a boosted voltage. The power supply booster 21 can be implemented by a charge pump or a DC/DC converter, for example.

The regulator 22 generates a bias voltage to be output from the voltage supply circuit 1. The regulator 22 has a reference voltage supply 222 and a noninverting amplifier 221. The reference voltage supply 222, which may be a band gap voltage supply (BGR) for example, generates a stable fixed voltage from the voltage of the power supply 7. The noninverting amplifier 221 operates with the voltage generated in the power supply booster 21 as a power supply voltage. The noninverting input terminal of the noninverting amplifier 221 receives a stable reference voltage from the BGR 222 while the inverting input terminal receives a feedback input through a feedback resistor. A resistance value of the feedback resistor is set by the output voltage setting part 23, which is detailed later.

The noninverting amplifier 221 amplifies the voltage supplied to its noninverting input terminal and outputs it as a bias voltage. An amplification degree is determined by a resistance value of the feedback resistor. To be exact, it is determined by a ratio of a resistance value of the feedback resistor and a resistance value of a resistor connected between the noninverting input terminal of the noninverting amplifier 221 and the ground. Thus, the bias voltage output from the voltage supply circuit 1 is set by a feedback resistance value of the output voltage setting part 23.

The output voltage setting part 23 sets a bias voltage to be output from the regulator 22. The output voltage setting part 23 makes the settings of the bias voltage by changing a feedback resistance value to the amplifier 221. The output voltage setting part 23 has a first feedback resistor 231 and a second feedback resistor 232. The first feedback resistor 231 is used during the high sensitivity mode, and the second feedback resistor 232 is used during the low sensitivity mode. The output voltage setting part 23 selectively uses the first or the second feedback resistor according to a mode specifying signal, thereby switching between the high sensitivity mode and the low sensitivity mode.

In the voltage supply circuit 1 of the first embodiment, the BGR 222 generates a reference voltage based on the voltage supplied from the power supply 7. The reference voltage is amplified by the noninverting amplifier 221 and output as a bias voltage. At this time, the output voltage setting part 23 receives a mode specifying signal and selects either the first feedback resistor 231 or the second feedback resistor 232. The power required for the noninverting amplifier 221 to output an amplified voltage is generated by the power supply booster 21. Use of the voltage supply circuit 1 of this configuration allows generation of bias voltages for the high sensitivity mode and the low sensitivity mode, and the capacitor microphone unit operates therewith.

The configuration of the output voltage setting part 23 for adjusting the bias voltage is described in further detail below. The output voltage setting part 23 of the first embodiment includes the first and second feedback resistors 231 and 232, first and second selectors 233 and 234, a data processor 235, and a memory 236. The feedback resistors 231 and 232 include a plurality of resistors that are serially connected between the output terminal of the noninverting amplifier 221 and the ground. In the first embodiment, each of the feedback resistors 231 and 232 has eight resistors connected in series. The feedback resistors 231 and 232 are connected to the noninverting amplifier 221 in parallel with each other.

To the feedback resistors 231 and 232, the selectors 233 and 234 are connected respectively. Each of the selectors 233 and 234 has seven switches that are connected to the nodes between the resistors in the feedback resistors 231 and 232. In the selectors 233 and 234, one of the seven switches is selected according to a set value stored in the memory 236 as described later. The node that corresponds to the selected switch is connected to the inverting input of the noninverting amplifier 221 described above.

The output voltage setting part 23 has the memory 236 that stores a set value based on a sensitivity adjustment operation described later. The data processor 235 outputs the set value stored in the memory 236 and outputs a signal for selecting a switch in the selectors 233 and 234. The set value stored in the memory 236 corresponds to a set value for setting a feedback resistance value so as to adjust the bias voltage. The data processor 235 also receives a mode specifying signal and outputs a switch control signal for selectively connecting the first feedback resistor 231 or the second feedback resistor 232 to the amplifier 221.

Thus, the data processor 235 is a circuit that outputs a set value for specifying mode and adjusting a bias voltage.

The voltage supply circuit 1 of the first embodiment adjusts a first bias voltage value and a second bias voltage value in the sensitivity adjustment and stores this setting as a set value of the feedback resistor into the memory 236.

In the normal operation when actually using the capacitor microphone unit, the voltage supply circuit 1 receives a mode specifying signal only. At this time, in the output voltage setting part 23 in the voltage supply circuit 1, the data processor 235 outputs a stored set value together with a signal for selecting the first or the second feedback resistor. In the selectors 233 and 234, a switch corresponding to the data of the set value is selected, and an arbitrary number (1 to 7) of resistors of the eight resistors in the feedback resistor are connected to the noninverting amplifier 221. A feedback resistance value is set by this operation. An degree of amplification of the noninverting amplifier 221 is determined by the connected first or second feedback resistor and the number of resistors connected to the inverting input terminal in each feedback resistor. A bias voltage is output thereby.

In this configuration, the capacitor microphone unit of the first embodiment operates in the high sensitivity mode or the low sensitivity mode. Variation in sensitivity of the capacitor microphone unit can be corrected by applying a bias voltage that has been adjusted in the voltage supply circuit 1 according to the sensitivity adjustment. This allows the capacitor microphone unit to have the stable sensitivity.

Figure 3:
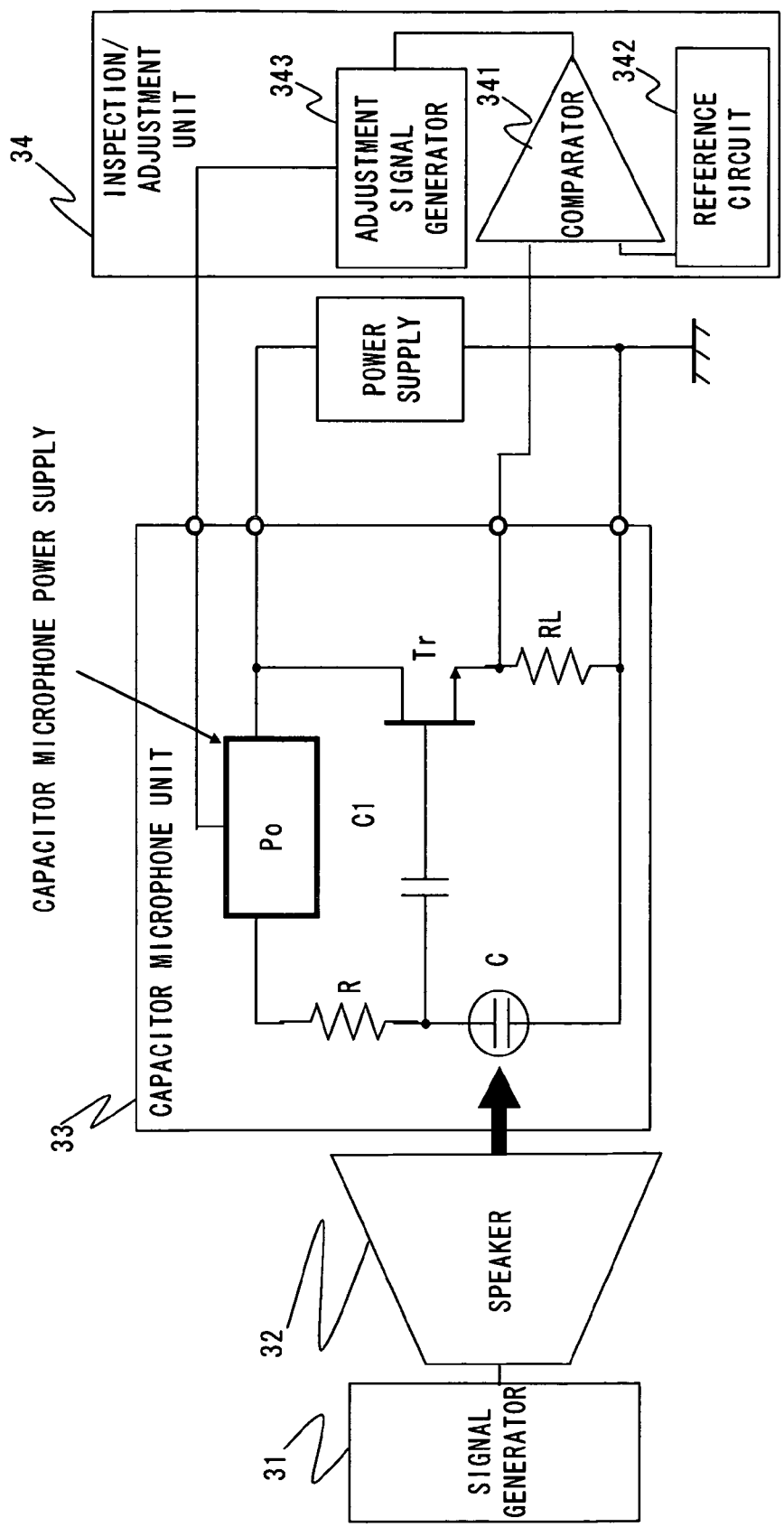
FIG. 3 is a view showing a sensitivity adjustment apparatus of the present invention.

The sensitivity adjustment is described herein. FIG. 3 shows the configuration of a sensitivity adjustment apparatus that is used for adjusting the sensitivity of the capacitor microphone unit in the first embodiment. The sensitivity adjustment apparatus includes a signal generator 31, a speaker 32, a capacitor microphone unit 33, and an inspection and adjustment unit 34.

The signal generator 31 is a device that generates a signal with a predetermined frequency, for example. It generates a signal corresponding to a reference tone in the sensitivity adjustment. The speaker 32 supplies the signal generated by the signal generator 31 as an actual tone to the capacitor microphone unit 33. Since the capacitor microphone unit 33 is the same as the capacitor microphone unit shown in FIG. 1, it is not detailed herein. The inspection and adjustment unit 34 measures a signal output from the capacitor microphone unit and outputs a set value to be stored into the voltage supply circuit 1 of the capacitor microphone unit. The inspection and adjustment unit 34 includes a comparator 341, a reference circuit 342, an adjustment signal generator 343, and so on.

In the sensitivity adjustment method of the first embodiment, the signal generator 31 and the speaker 32 supply a reference tone to the capacitor microphone unit 33. The capacitor microphone unit 33 converts the reference tone to an electrical signal and outputs it. The signal output from the capacitor microphone unit 33 is supplied to one input terminal of the comparator 341 in the inspection and adjustment unit 34. The other input terminal of the comparator 341 is supplied with a reference voltage for comparison. The reference voltage is stored in the reference circuit 342 as a level of a signal to be output from the capacitor microphone when a reference tone is input. The comparator 341 compares the reference voltage with the output level of the capacitor microphone unit and outputs a comparison result to the adjustment signal generator 343. The adjustment signal generator 343 determines an amount to change a bias voltage from a difference between the output level of the capacitor microphone unit and the level of the reference voltage. Then, it outputs a set value for setting the voltage to be output from the voltage supply circuit 1, which is a set value for setting a feedback resistance value of the feedback resistor. The set value is supplied to the output voltage setting part 23 in the voltage supply circuit 1 and stored in the memory 236.

Figure 4:
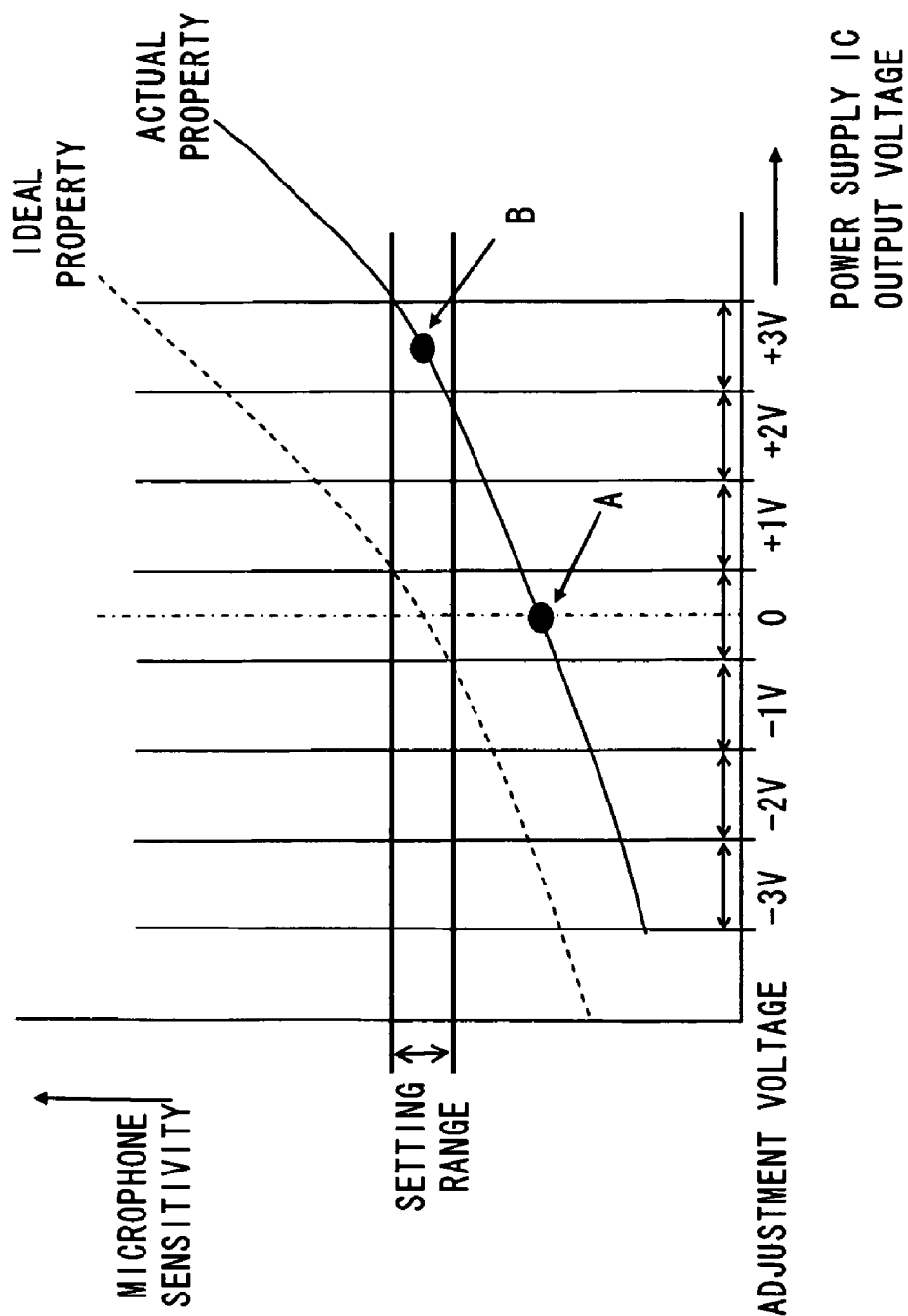
FIG. 4 is a view showing the relationship between the sensitivity of a capacitor microphone unit and a bias voltage.

FIG. 4 is a view showing the relationship between the sensitivity of the capacitor microphone unit and the bias voltage. FIG. 5 is a view showing the set values output from the adjustment signal generator 343 and an adjustment amount for a bias voltage.

As described above, the inspection and adjustment unit 34 determines an amount to change a bias voltage from a difference between the output level of the capacitor microphone unit and the reference voltage. FIG. 4 shows the relationship between the sensitivity and the adjustment amount as well.

For example, if the output signal of the capacitor microphone unit is low level and the sensitivity is lower than a setting range, a bias voltage for the capacitor microphone is raised to increase the sensitivity. At this time, an amount to raise the bias voltage is also determined by the amount of deviation of the sensitivity from the setting range. If the sensitivity of the capacitor microphone unit is higher than the setting range, an amount to lower the bias voltage of the capacitor microphone unit is determined.

If the bias voltage of the capacitor microphone is 24V and the output level of the capacitor microphone unit indicates the sensitivity corresponding to the point A in FIG. 4, it is determined to raise the bias voltage by 3V. Raising the bias voltage by 3V allows the capacitor microphone unit to indicate the sensitivity at the point B in FIG. 4, which is within the setting range. The adjustment signal generator 343 generates data corresponding to the setting to raise the bias voltage by 3V during the high sensitivity mode and supplies it to the memory 236 in the voltage supply circuit 1. FIG. 5 shows the list of the set values to be output from the voltage signal generator 343 so as to indicate the settings such as "bias voltage +3V in the high sensitivity mode". As shown in FIG. 5, the set value is output as serial data of 7 bits. The most significant bit (MSB) of the 7-bit data is a bit that indicates whether it is the high sensitivity mode or the low sensitivity mode, and the three bits from the second to fourth digit are bits for selecting one from the seven switches included in the first selector 233. The three bits from the fifth to seventh digit are bits for selecting one from the seven switches included in the second selector 234. As described earlier, a feedback resistance value is determined by selecting the switch in each selector, and a bias voltage is thereby set.

This embodiment uses the 7-bit data since the bias voltage is adjustable 1V by 1V up to ±3V in the high sensitivity mode and the low sensitivity mode. However, the number of bits may be varied according to a voltage setting amount or range, the number of sensitivity modes and so on.

In this way, the sensitivity adjustment apparatus of the first embodiment determines a set value for the voltage supply circuit 1 from a difference between the output of the capacitor microphone unit and the reference voltage. The data is stored into the memory 236 in the voltage supply circuit 1. It is thereby possible to produce a capacitor microphone unit where the sensitivity of each unit does not vary widely.

Figure 6:
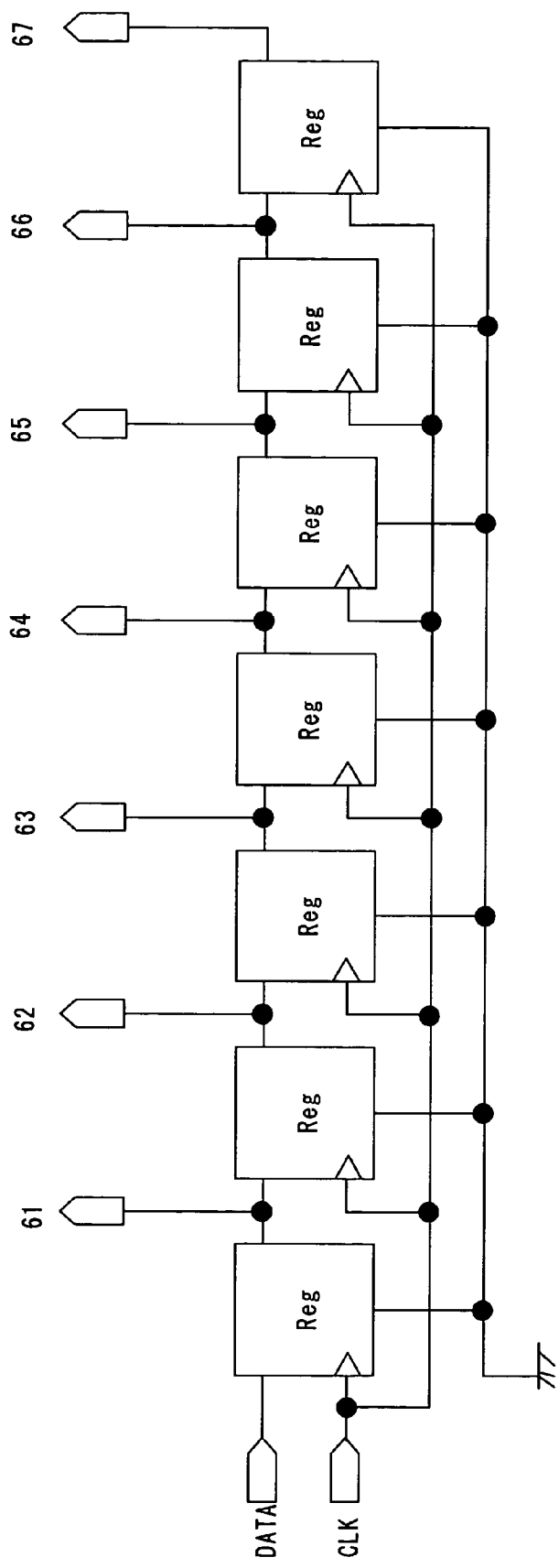
FIG. 6 is a view showing a shift register in a data processor.

Referring back to FIG. 2, the configuration of the data processor 235 to receive the 7-bit data is described in detail. The data processor 235 includes seven stages of shift registers as shown in FIG. 6. The shift registers are supplied with the 7-bit serial data corresponding to the set value described above and a clock from the outside in the sensitivity adjustment operation. The shift registers sequentially take in the serial data in synchronization with the falling edge of the clock and therefore take in all of the 7-bit serial data in 7 clocks. Acquiring the output of each stage of the shift register upon taking in the 7-bit serial data allows converting the serial data into the parallel data. In FIG. 6, output terminals 61 to 67 serve as output terminals of the parallel data.

The output terminals 62, 63 and 64 that respectively correspond to the second, third and fourth digits are connected to the memory for the first selector 233. The output terminals 65, 66 and 67 that respectively correspond to the fifth, sixth and seventh digits are connected to the memory for the second selector 234.

Figure 7:
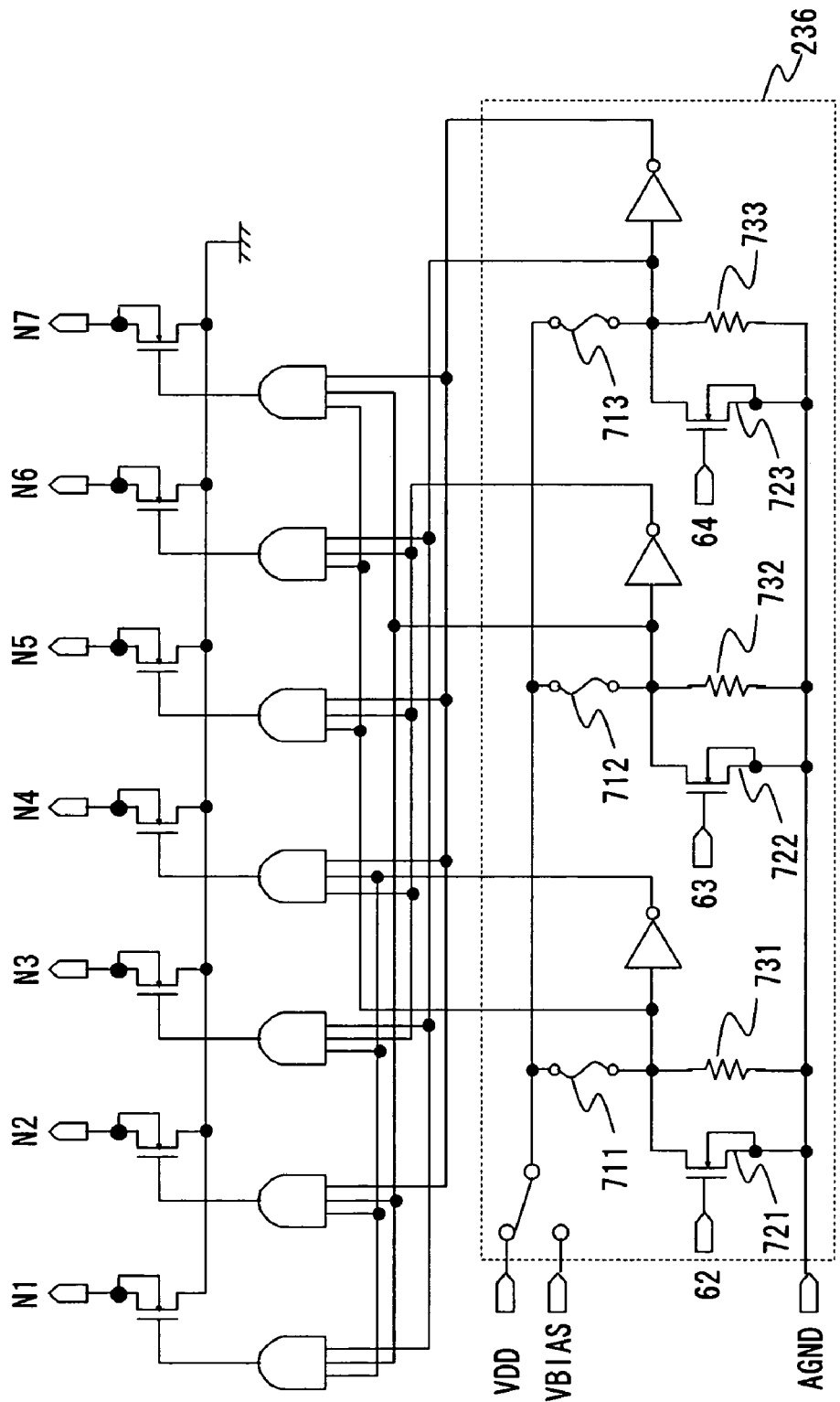
FIG. 7 is a circuit diagram showing the configuration from a memory corresponding to a first selector to a switch in the first selector.

FIG. 7 is a circuit diagram showing the configuration from the memory 236 corresponding to the first selector 233 to the switches in the first selector 233. As shown in FIG. 7, the memory 236 in the first embodiment is composed of fuse elements that are placed between the shift register of the data processor and the selector. The memory 236 corresponding to the first selector 233 has three fuse elements 711, 712 and 713 and switch elements 721, 722 and 723. The fuses and switches are serially connected between a power supply line and a ground. The switch elements are connected to the ground side with respect to the fuse elements, and high resistors 731, 732 and 733 are connected between the fuse elements and the ground, in parallel with the switch elements.

The gates of the switch elements 721, 722 and 723 respectively receive the data corresponding to the second, third, fourth digits that have been converted into parallel data. Thus, the switch elements 721, 722 and 723 are connected to the parallel data output terminals 62, 63 and 64, respectively, shown in FIG. 6. It is assumed that a signal corresponding to the setting of "raising a bias voltage by 3V in the high sensitivity mode" described above, which is the second digit is 1, the third and the fourth digit is 0 as shown in FIG. 5, is supplied herein. This turns on only the switch element 721 corresponding to the bit of the second digit and turns off the other switch elements 722 and 723. During the sensitivity adjustment, a fuse cutout voltage VBIAS is supplied from the inspection and adjustment unit in this state. Specifically, a power supply line is connected to the fuse cutout voltage VBIAS when adjusting the sensitivity. If the fuse cutout voltage VBIAS is supplied, overcurrent flows only into the fuse element 711 that is connected to the switch element 721 in the on-state, and the fuse element 711 is cut thereby. The overcurrent do not flow into the other fuse elements 712 and 713 since the switch elements 722 and 723 are in the off-state and connected to the ground only through the high resistors 732 and 733, respectively. After the fuse cutout, the fuse cutout voltage VBIAS is separated from the power supply line.

In the first embodiment, the above set values are stored in the fuse cutout state. A normal operation is described herein. In the normal operation, the power supply line is connected to a normal circuit power supply VDD and only the fuse 711 is cut. In the memory 236, the node between the fuse element and the high resistor (switch element) is connected to the logic circuit in the first selector 233, which is AND gates connected to seven switches in the selector in the example shown in FIG. 7. In this case, the node between the fuse element 711 and the high resistor 731 corresponding to the fuse cutout portion is at a ground voltage (Low level) while the nodes between the fuse elements 712, 713, and the high resistors 732, 733, respectively, where the fuses are not cut are at a power supply voltage (High level). Thus, in the circuit of FIG. 7, the switch of the selector is selected by outputting High level from the AND gate where all the inputs are at High level, which is the AND gate at the far left in FIG. 7.

Though FIG. 7 shows only the connection of the memory corresponding to the first selector 233 and the first selector 233, the memory 236 composed of fuses is formed in the same manner for the second selector 234 also so that set values are stored by cutting the fuses.

In this way, the set values set by the sensitivity adjustment operation are stored in the output voltage setting part 23 and a bias voltage is generated according to the set values.

As described above, this embodiment determines the set value for setting the sensitivity of the capacitor microphone unit by the sensitivity adjustment operation and stores the values into the voltage supply circuit for the capacitor microphone. Since the voltage supply circuit of the capacitor microphone sets a feedback resistance value based on the set value, it is possible to produce a capacitor microphone unit with no sensitivity variation. Further, since the bias voltage is a voltage that is amplified from a reference voltage by a noninverting amplifier, it is possible to supply a stable bias voltage with low ripple.

Second Embodiment

Figure 8:
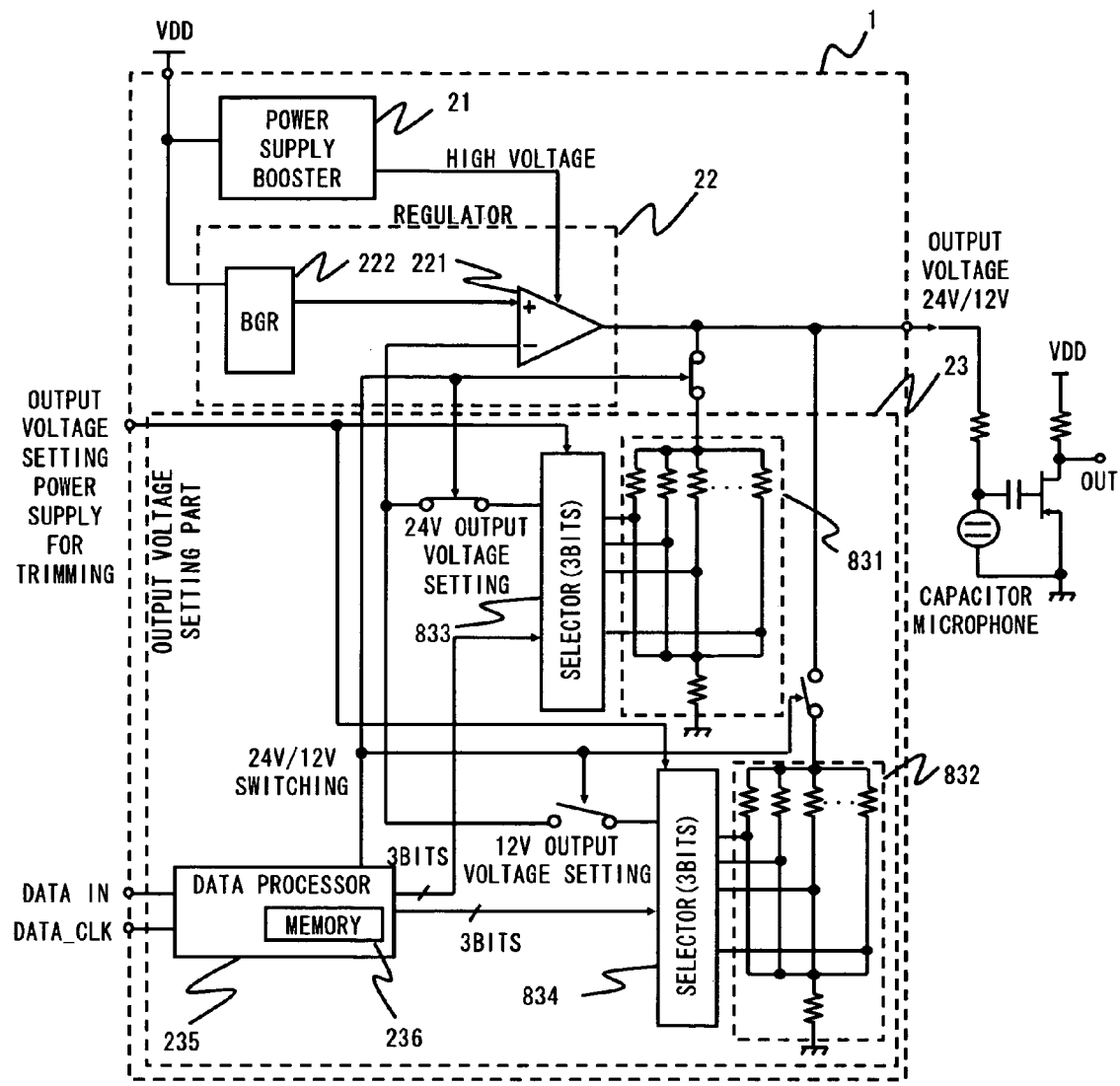
FIG. 8 is a view showing a capacitor microphone unit according to a second embodiment of the invention.

FIG. 8 is a view showing a capacitor microphone unit according to a second embodiment of the present invention.

In FIG. 8, the same elements as in the first embodiment are denoted by the same reference symbols and not described herein.

The second embodiment is different from the first embodiment in the configuration of a first feedback resistor 831, a second feedback resistor 832, a first selector 833, and a second selector 834. In the feedback resistors 231 and 232 of the first embodiment, a plurality of resistors are connected in series and a switch is connected to a node between the resistors. On the other hand, in the feedback resistors 831 and 832 of the second embodiment, seven resistors are connected in parallel and one resistor is connected in serial to the seven resistors. One end of the resistor is connected to the ground. Though the first and second selectors 833 and 834 each have seven switches as in the first embodiment, they are connected in a different way. On end of each switch element is connected to a node between the resistor connected to the ground and the seven resistors connected in parallel. The other end of each switch is connected to the noninverting input terminal of the noninverting amplifier 221.

In this embodiment, resistance values of the seven resistors arranged in parallel are different from each other. Just like in the first embodiment, the data processor 235 supplies a set value for selecting one from the seven switches in the selectors 833 and 834. Thus, an arbitrary one of the seven resistors having different resistance values is connected to the inverting input terminal of the noninverting amplifier in the second embodiment. In this way, the second embodiment sets a feedback resistance value by selecting an arbitrary one from the resistors with different resistance values and connecting it to the inverting input terminal.

Since the first embodiment connects an arbitrary node between the resistors connected in series, it is sometimes difficult to set an amplification degree of the noninverting amplifier accurately. For example, if the number of resistors between the output of the noninverting amplifier and the node connected to the inverting input terminal is one in the first embodiment, the number of resistors connected from the node to the ground is seven. If the number of resistors between the output of the noninverting amplifier and the node connected to the inverting input terminal is two, the number of resistors connected from the node to the ground is six. Since the degree of amplification of the amplifier 221 varies by the ratio of the resistance value of the feedback resistor connected to the inverting input terminal and the resistance value of the resistor connected between the inverting input terminal and the ground, the setting of the resistance value of each resistor connected in series is complex in the first embodiment. It is therefore sometimes difficult to adjust the bias voltage accurately. On the other hand, in the configuration of the voltage supply circuit 1 of the second embodiment, it is easy to adjust the ratio of the resistance value of the feedback resistor connected to the inverting input terminal and the resistance value of the resistor connected between the inverting input terminal and the ground, thereby improving the accuracy of the setting of a bias voltage.

Third Embodiment

Figure 9:
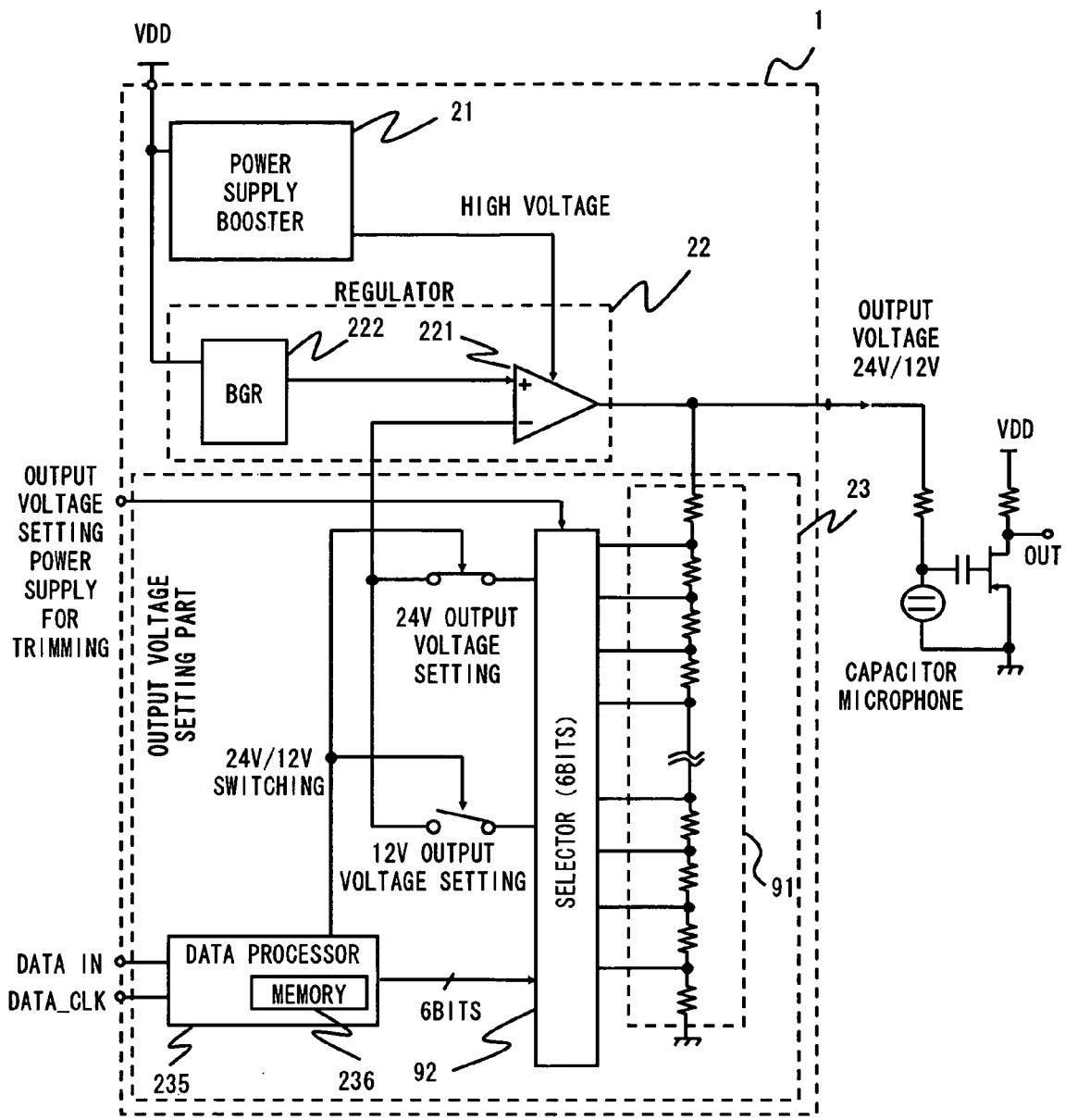
FIG. 9 is a view showing a capacitor microphone unit according to a third embodiment of the invention.

FIG. 9 is a view showing a capacitor microphone unit according to a third embodiment of the present invention. In FIG. 9, the same elements as in the first embodiment are denoted by the same reference symbols and not described herein.

In the third embodiment, first and second feedback resistors and first and second selectors are collected into one feedback resistor 91 and one selector 92, respectively. The feedback resistor 91 includes a plurality of resistors connected in series. The selector 92 includes a plurality of switches connected between the node between the resistors and the inverting input terminal. The voltage supply circuit 1 of the third embodiment determines a feedback resistance value by the combination of switches selected in the selector 92.

Though the first embodiment sets a feedback resistance value by selecting one from the seven switches connected to the nodes between the eight resistors, the third embodiment can select a plurality of switches by changing the correspondence between data of a set value to be set in the sensitivity adjustment and a selected switch.

For example, the number of bits of data to be set in the sensitivity adjustment is increased so as to correspond to the number of switches in the selector. Then, when adjusting the sensitivity, set values of the number of bits corresponding to the number of switches is stored in accordance with a voltage amount to be adjusted in the high sensitivity mode and the low sensitivity mode. During the normal operation, the connection of the node between the resistors of the feedback resistor and the inverting input terminal is determined for each switch in the selector based on the set value.

If the eight resistors are connected in series and the seven switches are formed in the selector as in the first embodiment, there are 128 ways of selecting a switch. In this case, the set value to be stored in the memory is combinational data of a switch in the high sensitivity mode and combinational data of a switch in the low sensitivity mode. Thus, a set value obtained in the sensitivity adjustment is 7-bit data corresponding to each switch and the memory 236 stores two patterns of 7-bit combinations. By changing the correspondence between the set value stored in the memory and the switch, it is possible to share the feedback resistor and the selector both in the high sensitivity mode and the low sensitivity mode and set a bias voltage with one feedback resistor 91 and one selector 92.

Fourth Embodiment

Figure 10:
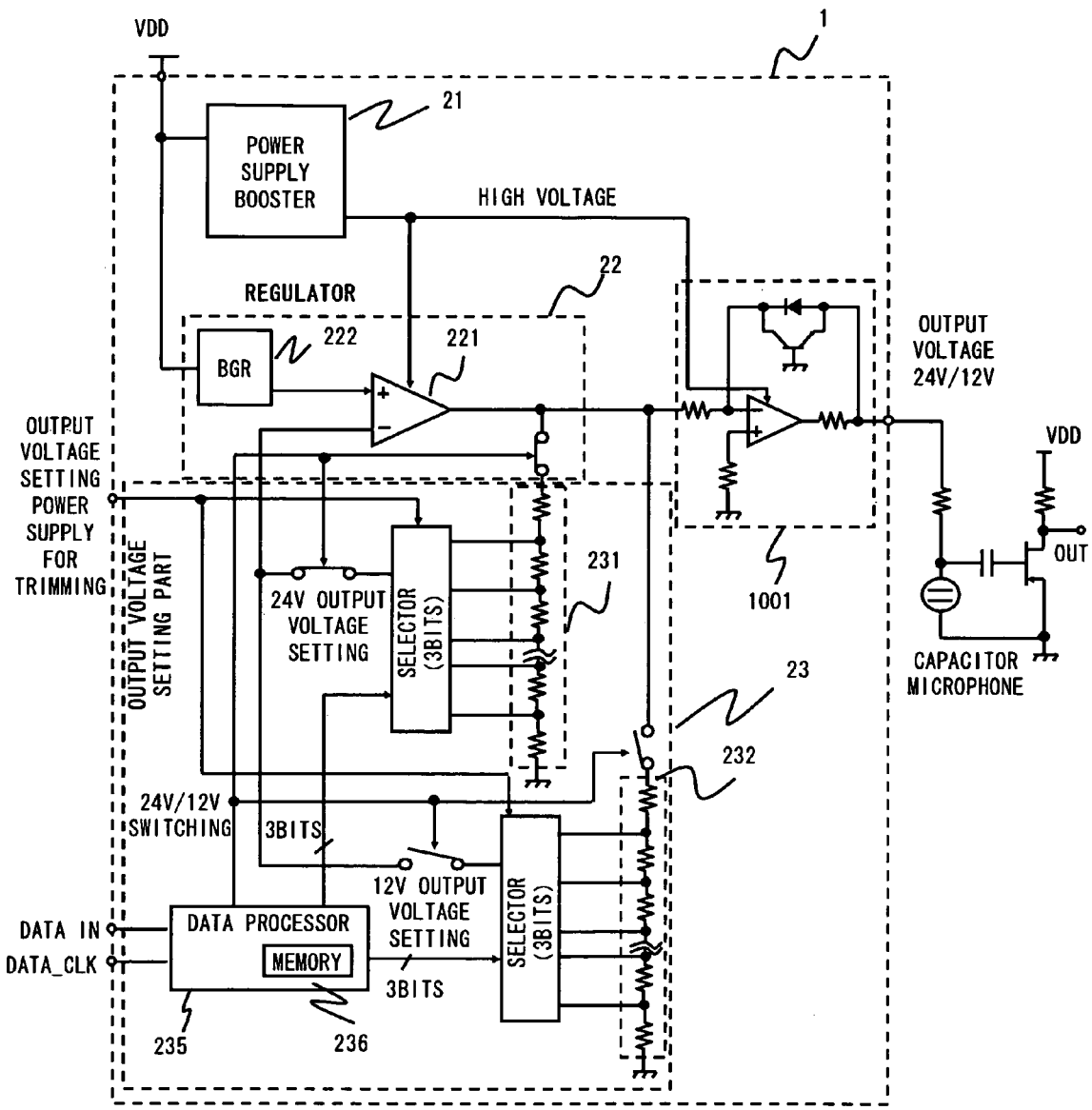
FIG. 10 is a view showing a capacitor microphone unit according to a fourth embodiment of the invention.

FIG. 10 is a view showing a capacitor microphone unit according to a fourth embodiment of the present invention. In FIG. 10, the same elements as in the first embodiment are denoted by the same reference symbols and not described herein.

In the fourth embodiment, a logarithmic amplifier 1001 is connected to the output of the noninverting amplifier 221. The fourth embodiment amplifies the voltage output from the noninverting amplifier 221 further by an amplifier called a logarithmic amplifier and supplies it as a bias voltage to the capacitor microphone 2. The logarithmic amplifier is an amplifier where the output increases exponentially with respect to the input.

In the fourth embodiment, the logarithmic amplifier 1001 has an operational amplifier, a diode, a bipolar transistor, and a resistor. A noninverting input terminal of the operational amplifier receives the output of the noninverting amplifier 221 through an input resistor. The noninverting input terminal of the operational amplifier is connected to the ground through a resistor. The output of the operational amplifier is fed back to the inverting input terminal through an output resistor and the diode and the bipolar transistor connected in parallel with each other. The logarithmic amplifier 1001 receives a voltage boosted by the power supply booster as a power supply voltage.

Generally, as the bias voltage for a capacitor microphone unit increases, the sensitivity of the capacitor microphone unit increases exponentially. Thus, the fourth embodiment uses a logarithmic amplifier that has substantially the same input-output characteristics as the characteristics of the capacitor microphone for a bias voltage.

In the logarithmic amplifier, the output increases exponentially with respect to a change in the input as described above. For example, in the voltage supply circuit of the first embodiment, the noninverting amplifier adjusts a bias voltage for the capacitor microphone in the range of ±3V. However, since the fourth embodiment amplifies the output of the noninverting amplifier by the logarithmic amplifier, it is possible to adjust a bias voltage in a larger range than ±3V.

Alternative Embodiment

Figure 11:
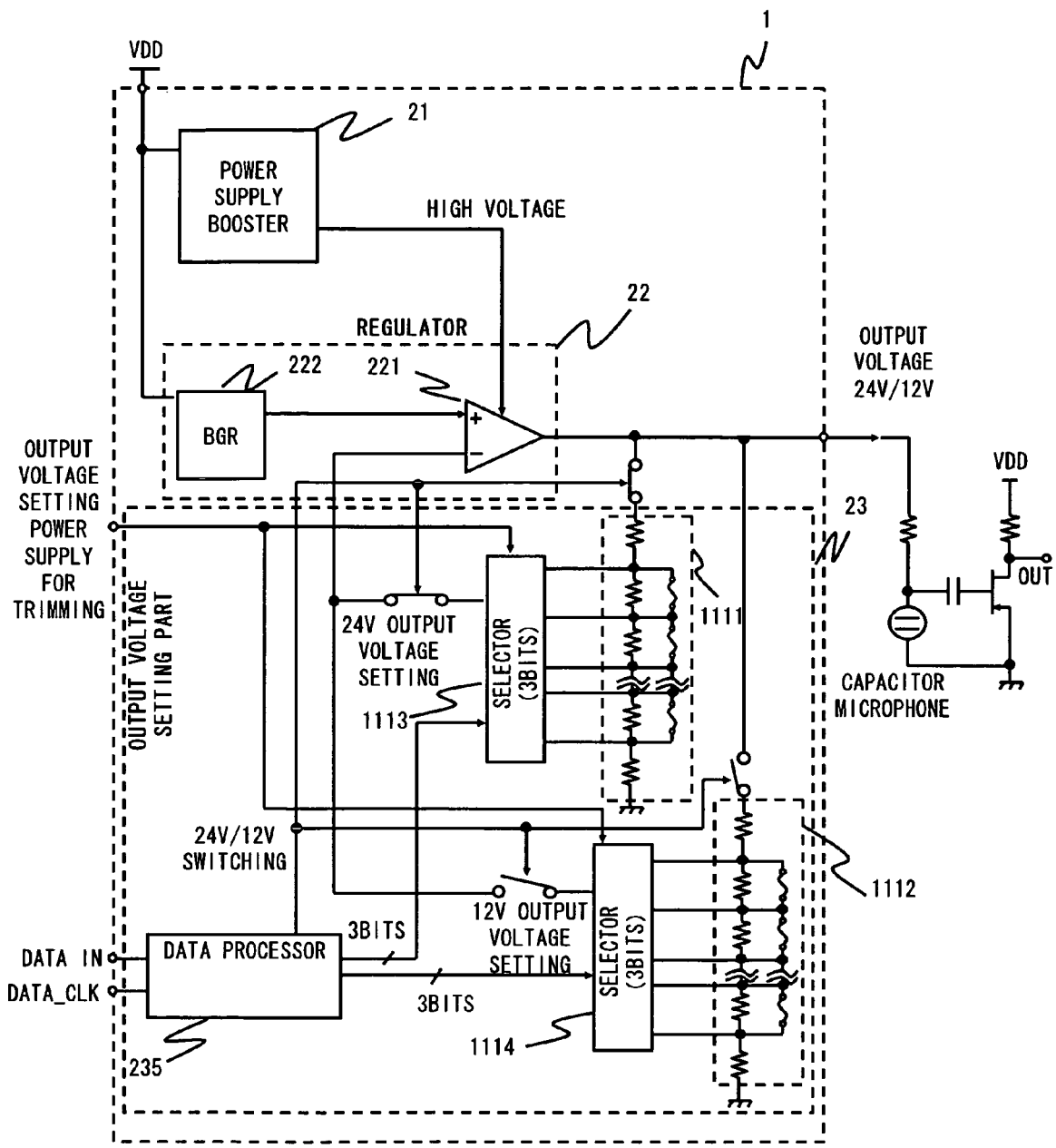
FIG. 11 is a view showing a case of using another circuit as a memory.

Although a memory having three fuse elements, which is the memory 236, selects an arbitrary one from seven switches in the first embodiment, it is feasible to use another configuration for the memory. FIG. 11 is a view showing a case where another circuit is used as the memory. Though the memory 236 is placed between the data processor 235 and the selector 233 in the first embodiment, a memory is placed in parallel with a feedback resistor in this alternative embodiment. Fuses are placed in parallel with a plurality of resistors of the feedback resistor.

Figure 12:
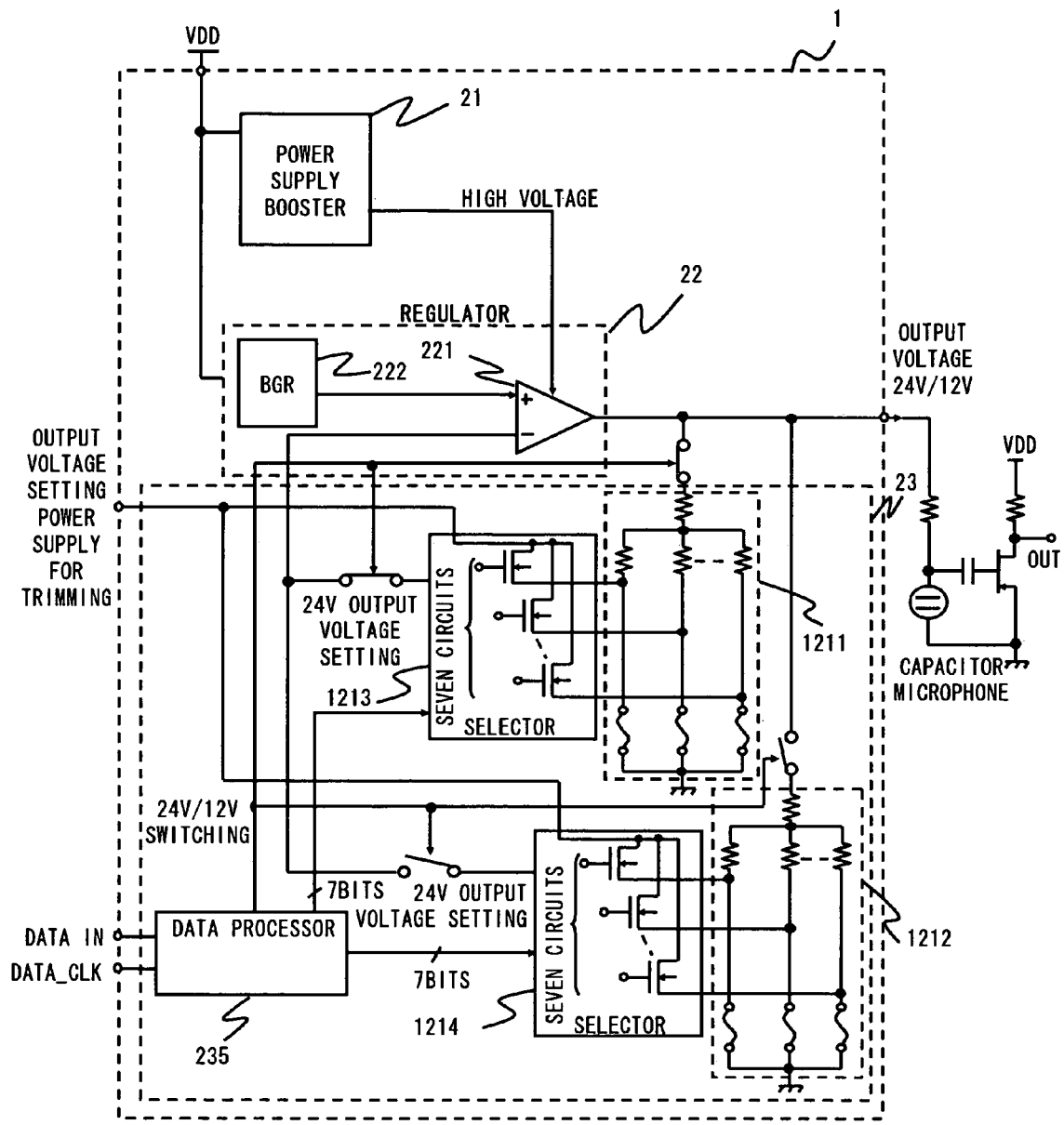
FIG. 12 is a view showing a case of using another circuit as a memory.

Then, an arbitrary fuse of the seven fuses is cut in accordance with a voltage amount to be adjusted in the sensitivity adjustment operation. It is feasible to form a memory by placing fuses in parallel with the feedback resistor and cutting a fuse during the sensitivity adjustment in this way. This configuration is applicable to any of the second to fourth embodiments. FIG. 12 shows a case where still another alternative embodiment is applied to the second embodiment. A memory shown in FIG. 12 stores a set value by placing a fuse between each feedback resistor and switch and cutting an arbitrary fuse during the sensitivity adjustment.

Though the above embodiments form a memory by using fuses, a memory is not restricted to a fuse element but Zener-zap or EEPROM may be used instead. Zener-zap is an element that operates oppositely from a fuse. While the fuse stores data with given two points always open by cutting, Zener-zap stores data with given two points always short-circuited by breakdown. Such a memory may be implemented by replacing the fuses of the alternative embodiment shown in FIG. 11 by Zener-zap element, for example.

Figure 13:
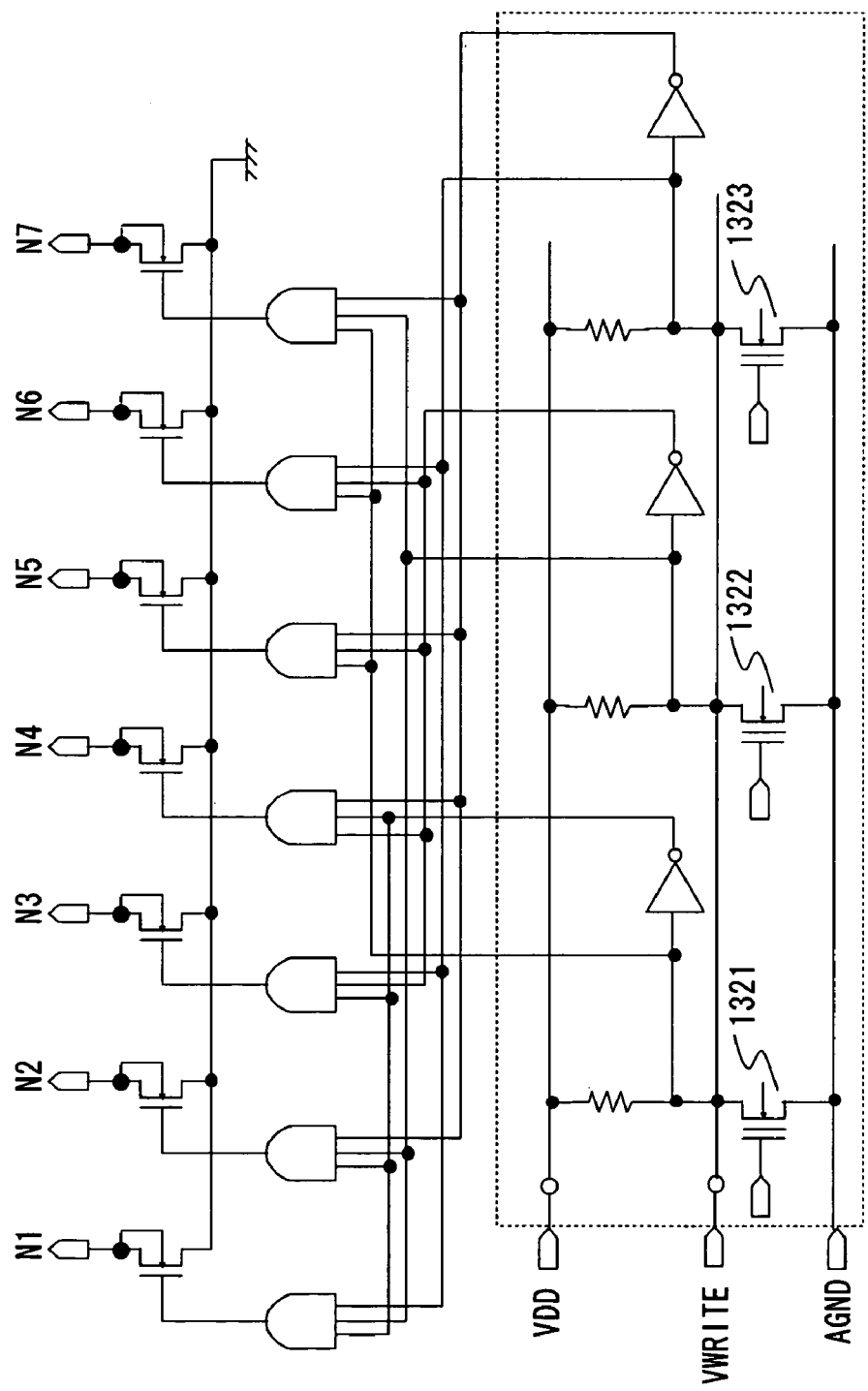
FIG. 13 is a view showing a case of using another circuit as a memory.

FIG. 13 is a circuit diagram showing the configuration where the fuses that form the memory of the first embodiment shown in FIG. 7 are replaced with EEPROM. In order to obtain the same output as the memory in the first embodiment in the circuit having the configuration of FIG. 13, a high voltage is applied to Vwrite as a write voltage during the sensitivity adjustment. Further, a signal of Low level is supplied to the control gate of an EEPROM element 1321, and a signal of High level is supplied to the control gates of EEPROM elements 1322 and 1323. As a result, in the EEPROM element 1321, electrons on a floating gate are discharged to become in a constant on state. On the other hand, in the EEPROM elements 1322 and 1323, electrons on a floating gate are not discharged to stay in an erased state. Since no voltage is applied to Vwrite and the control gate after completing the sensitivity adjustment operation, the elements in the erased state are constantly off, and a signal of Low level is supplied only to the inverter at the far left in FIG. 13. Thus, only the AND gate at the far left in FIG. 13 outputs High level to select a switch as is the case with the first embodiment.

Though the power supply booster 21 boosts a power supply voltage to a constant level regardless of a mode specifying signal in the above embodiments, it is feasible to input a mode specifying signal also to the power supply booster 21 so that it generates a voltage required for the amplifier according to the mode.

Fifth Embodiment

Figure 14:
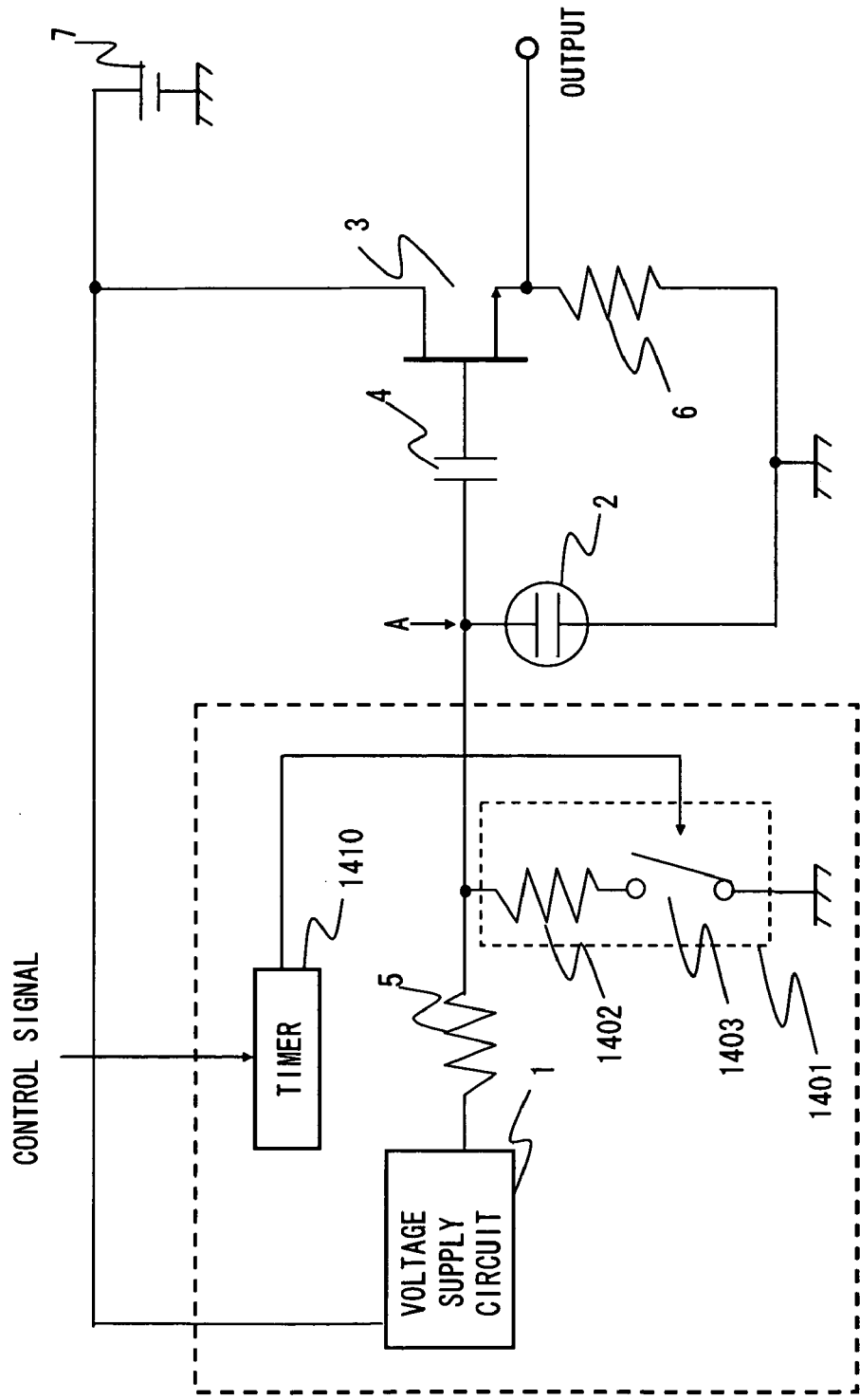
FIG. 14 is a view showing a capacitor microphone unit according to a fifth embodiment of the invention.

FIG. 14 is a view showing a capacitor microphone unit according to a fifth embodiment of the present invention. In this embodiment, a discharger 1401 and a timer 1410 for the capacitor microphone 2 are added to the voltage supply circuit 1 of the first to fourth embodiments and the alternative embodiments. In this embodiment, the voltage supply circuit 1, the resistor 5, the discharger 1401 and the timer 1410 are formed as one LSI chip (semiconductor device). This embodiment refers to the configuration formed in one chip as a power supply circuit. In FIG. 14, the same elements as in FIG. 1 are denoted by the same reference symbols and not described herein.

As described in the first embodiment with reference to FIG. 1, the bias voltage output from the voltage supply circuit 1 is supplied to the capacitor microphone 2 through the resistor 5. The resistor 5 may have a resistance value of about 1 to 10 GΩ, for example, and preferably has a resistance value of about 1 GΩ. The resistor is placed so as to match impedances since the impedance of the gate of the JFET 3 is large. The discharger 1401 of this embodiment is connected between the node A between the resistor 5 and the capacitor microphone 2 and the ground.

The discharger 1401 has a discharge resistor 1402 with resistance of about 100 to 1000 kΩ and a switch 1403 of N-type MOSFET, for example. The switch 1403 is connected to the timer 1410 and turns on or off according to a command from the timer 1410. The discharger 1401 serves as rapid discharging means.

The timer 1410 receives an external control signal and supplies an operation command to the switch 1403. This is controlled according to a separate signal from a CPU (not shown) or the like, for example. Specifically, a CPU or the like, which is not shown, detects ON or OFF of a power supply for a power supply circuit and performs control by supplying a control signal to the timer, for example. The control signal may be a mode specifying signal described in the above embodiments. In this case, the timer may supply an operation command to a switch at the timing when the mode specifying signal changes from the high sensitivity mode to the low sensitivity mode.

Figure 15:
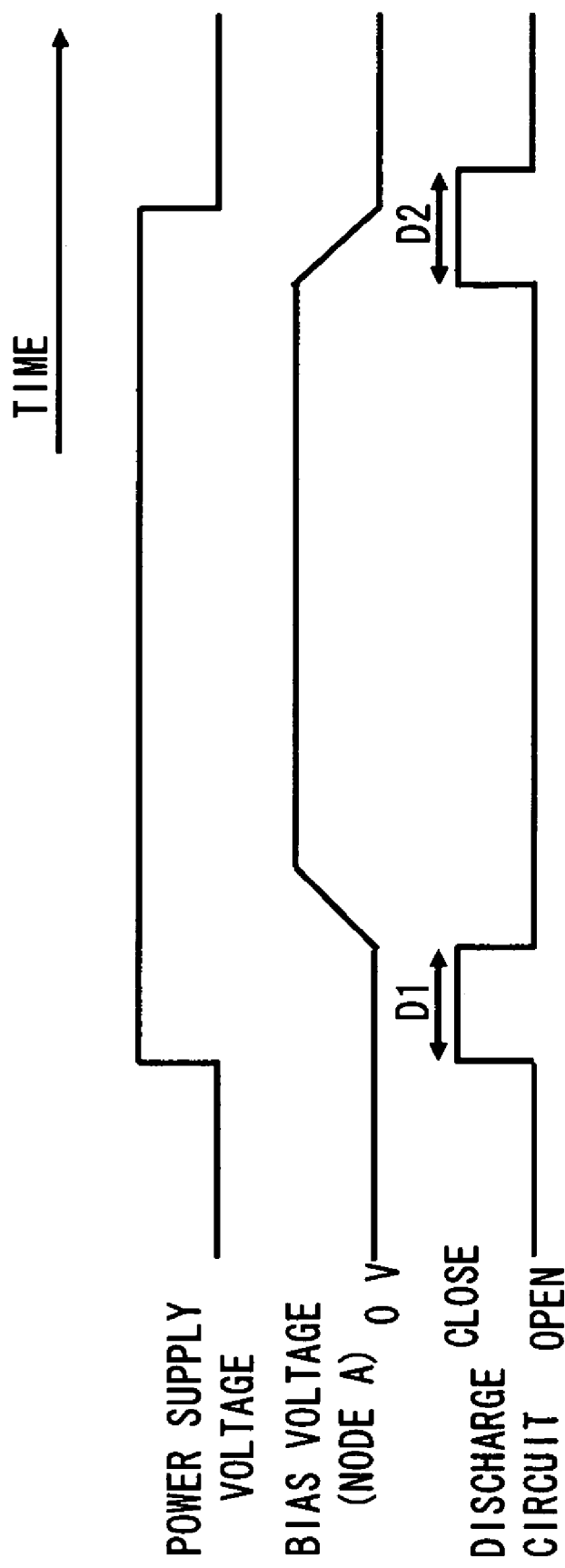
FIG. 15 is a view showing the operation of a capacitor microphone unit according to the fifth embodiment of the invention.

The operation of the discharger 1402 in the fifth embodiment is described herein with reference to FIG. 15. As described above, when a power supply voltage is applied, the timer 1410 receives a control signal from the outside and closes the discharge switch 1403 of the discharger 1401 for a predetermined time period (D1). A charge left in the capacitor microphone is thereby discharged rapidly, which causes no noise. When turning off the power supply circuit, a control signal is also supplied from the outside before the power supply voltage drops. The timer 1410 receives the control signal and closes the discharger 1401 for a predetermined time period (D2), thereby rapidly discharging a charge left in the capacitor microphone.

A case without the discharger 1401 in this embodiment is described herein. If the discharger 1401 is not placed, a charge stored in the capacitor microphone is discharged into the ground of the voltage supply circuit 1 through the high resistor 5 for impedance matching. However, this discharge is extremely slow since the charge is discharged through the high resistor 5 and the internal circuit of the voltage supply circuit 1. If a charge is left in the capacitor microphone 2, a charge of the gate of the JFET 3 connected to the capacitor microphone 2 through the capacitor 4 is also discharged very slowly. If the capacitor microphone 2 is repeatedly turned ON and OFF during transition of the discharge, the switching of ON and OFF causes noise.

For example, if the capacitor microphone allows switching between the high sensitivity mode and the low sensitivity mode as described in the first to fourth embodiments, the discharge of the capacitor microphone 2 and the gate of the JFET 3 is not sufficient when switching from the high sensitivity mode (bias voltage of 24V) to the low sensitivity mode (bias voltage of 12V) and therefore noise can occur.

In this embodiment, on the other hand, the discharger rapidly discharges the charge left in the capacitor microphone in response to switching of ON and OFF of a power supply or a mode specifying signal. It is thereby possible to switch without causing noise even when power ON/OFF switching or mode switching is performed during the transition of discharge. Specifically, the timer is set so as to close the switch for about 1 to 100 μ-seconds as D1 and D2.

Therefore, use of the power supply circuit of this embodiment ensures discharge even if a resistance value of the resistor 5 corresponding to the input impedance of the JFET 3 is high. If the discharger of this embodiment is not used, a resistor composed of polysilicon, for example, is connected between the gate and source so as to eliminate the gate charge of the JFET for noise reduction. This case, however, requires very accurate resistance control since thermal noise occurs if a resistance value of the resistor between the gate and source of the JFET is too low while discharge effect is low if it is too high. This embodiment allows elimination of the resistor since the operation of the microphone has no problem without the resistor between gate and source. Thus, it eliminates the need for strict resistance control of a polysilicon resistor placed between the gate and source of the JFET. It is feasible to use the resistor as a matter of course.

Sixth Embodiment

Figure 16:
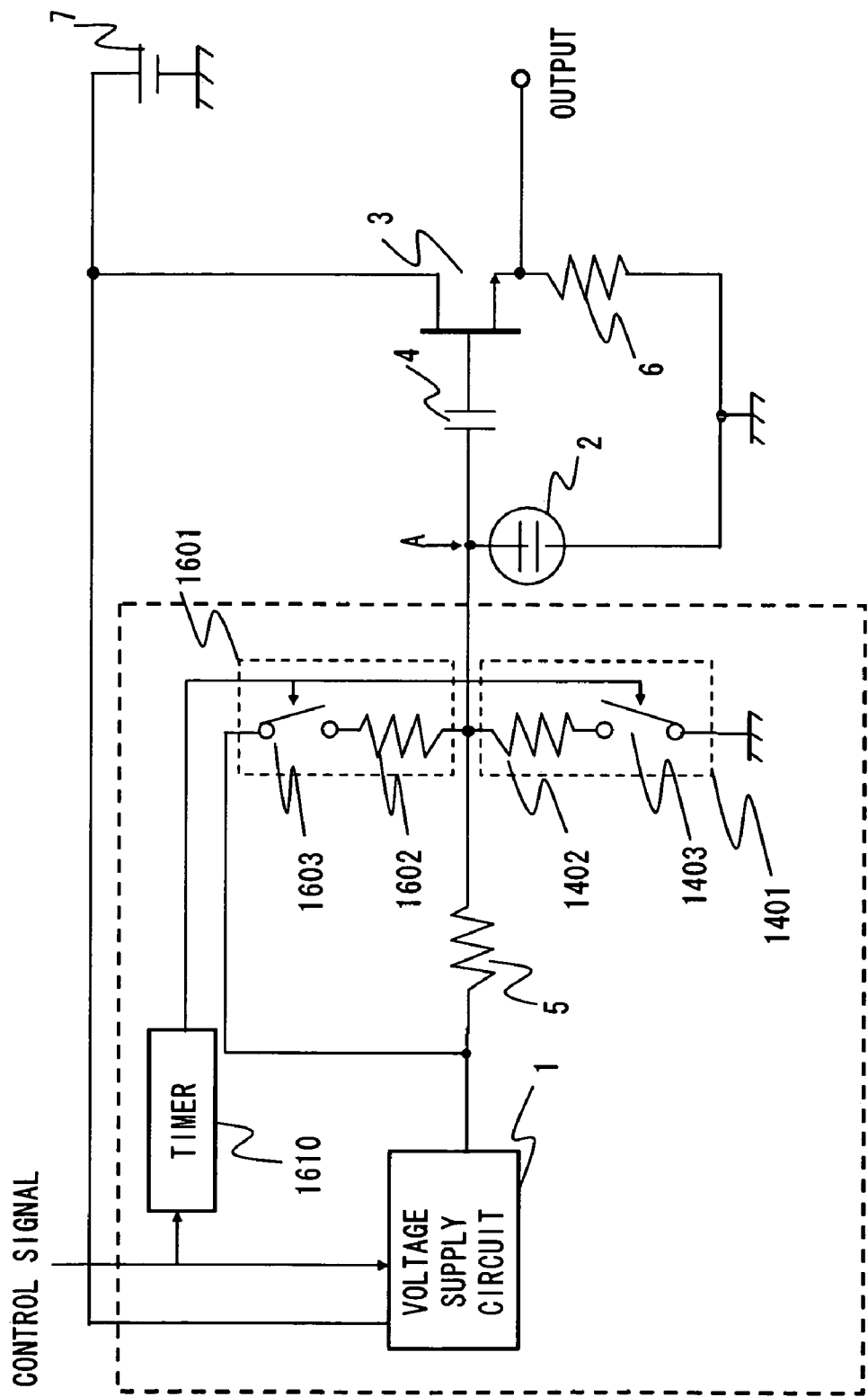
FIG. 16 is a view showing a capacitor microphone unit according to a sixth embodiment of the invention.
Figure 17:
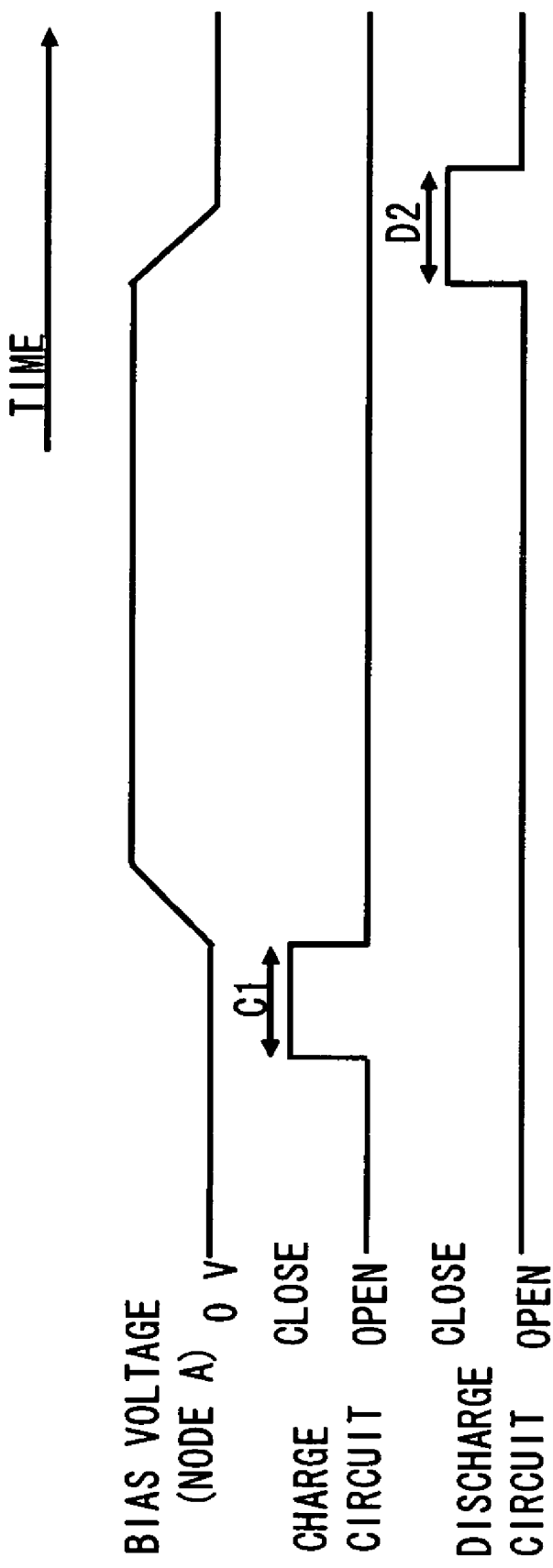
FIG. 17 is a view showing the operation of a capacitor microphone unit according to the sixth embodiment of the invention.

A sixth embodiment of the preset invention is described herein with reference to FIGS. 16 and 17. FIG. 16 is a view showing a microphone unit and a power supply circuit 160 according to the sixth embodiment. The power supply circuit of the fifth embodiment discharges a capacitor microphone in the switching of ON and OFF of a power supply or in the switching from the high sensitivity mode to the low sensitivity mode. The circuit of this embodiment can respond to switching from the low sensitivity mode to the high sensitivity mode as well. Thus, this embodiment is different from the fifth embodiment in having a charger 1601 in addition to the discharger 1401 and also having a timer 1610 for controlling open and close time of switches of the discharger 1401 and the charger 1601.

Though FIG. 16 illustrates the timer 1610 in one block for simplification, there are actually two timers, one for opening and closing the discharger 1401 and one for opening and closing the charger 1601. Thus, there are two signal lines from the timer 1610. The charger 1601 has a charge resistor 1602 with about 100 to 1000 KΩ and a switch 1603 composed of P-type MOSFET. The charger 1601 is inserted between the output of the voltage supply circuit 1 and the node A.

The operation of the timer 1610 and the switches is described later. The charge resistor and the discharge resistor preferably have resistance of about 100 to 1000 KΩ.

As described earlier, the voltage supply circuit 1 allows sensitivity switching. For example, the sensitivity switching is selected appropriately depending on a distance between a user and a microphone. The sensitivity may be raised if the user is far from the microphone and lowered (normal setting) if the user is close to the microphone, for example. The definition of being far or close may be set in various ways. For example, in a mobile phone or the like, it may detect the distance as being far when a user talks on the phone as seeing a display or with hands free and raise the sensitivity. On the other hand, it may detect the distance as being close when a user talks on the phone by bringing the mobile phone at the ear, which is when the face of the user cannot be recognized on a display, and lower the sensitivity. Thus, it is determined on the basis of whether a user's face is on a display or not, whether it is in hands-free or not and so on and a CPU or the like of a mobile phone outputs a sensitivity switching signal. The bias voltage is thereby raised or lowered to change the sensitivity.

In this case, the bias voltage can be raised and lowered frequently according to circumstances, and the discharge is more critical. Further, it is preferred to perform charge rapidly in consideration of the switching from the low sensitivity mode to the high sensitivity mode. This embodiment uses a charger for the case where the mode is switched from the low sensitivity mode to the high sensitivity mode and so on.

The operation of the sixth embodiment is described herein with reference to the timing chart of FIG. 17. In the capacitor microphone unit of this embodiment, the timer 1610 operates upon receiving a sensitivity switching signal. Based on the signal output from the timer 1610, the charger 1601 and the discharger 1401 operate for a predetermined period of time. The timer 1610 includes a timer for charging and a timer for discharging as described above, and a predetermined charge time C1 and a predetermined discharge time D2 are both about 1 to 100 μ-second.

For example, when the output voltage of the voltage supply circuit 1 is raised by an external switching signal in order to switch the sensitivity of the microphone, the switch 1603 of the charger 1601 is on for a predetermined time period C1. The interval is created by the internal timer. By turning on the switch and closing the circuit, the capacitor microphone 2 and the gate of the JFET 3 are charged at once. It is thereby possible to eliminate time delay, which is a problem in conventional techniques.

This operation is described in further detail with reference to the timing chart of FIG. 17. For example, upon receiving a sensitivity switching signal for raising a bias voltage from about 12V to about 24V, the switch 1603 of the charger 1601 is closed and the output of the voltage supply circuit 1 is supplied to the high resistor 5. At the same time, the timer 1610 is activated to perform rapid charging for about 1 to 100 u-seconds through the charge resistor 36. When the predetermined charge time period ends, the switch 1603 is opened to open the charger 35. The above operation is just an example, and the charger operates in the same manner when raising a bias voltage in the case of switching the sensitivity for two or more (a plurality of) predetermined bias voltages.

On the other hand, upon receiving a sensitivity switching signal for lowering a bias voltage from about 24V to about 12V, for example, the discharger 1401 operates and the switch 1403 is closed so as to perform rapid discharge through the discharge resistor 31. The time period to close the switch 1403 is also determined by the setting of the timer 1610, and the rapid discharge is performed for about 1 to 100 u-seconds, for example. This discharge is used as rapid discharge operation when changing the settings to reduce a voltage value or to lower the sensitivity in the selection from a plurality of predetermined bias voltages. Thus, the embodiment has a discharger as rapid discharging means.

This eliminates the need to place a high resistor with about 1 GΩ between the gate and source of JFET for discharge of the capacitor microphone and the JFET gate, which has been required in a conventional configuration. A noise due to the high resistor thereby does not occur to improve sound quality characteristics. Further, the biased high resistor, capacitor microphone and JFET gate form a low pass filter structure, thereby eliminating wow flutter and so on outside the audible range as well The power supply circuit may be formed as one chip of LSI or semiconductor device. In this case, the resistor is placed in series with the charger, bias power supply circuit and discharger when viewed from the output terminal, and electrostatic discharge tolerance of the output terminal of the power supply circuit, which is not shown, thereby increases.

Seventh Embodiment

Figure 18:
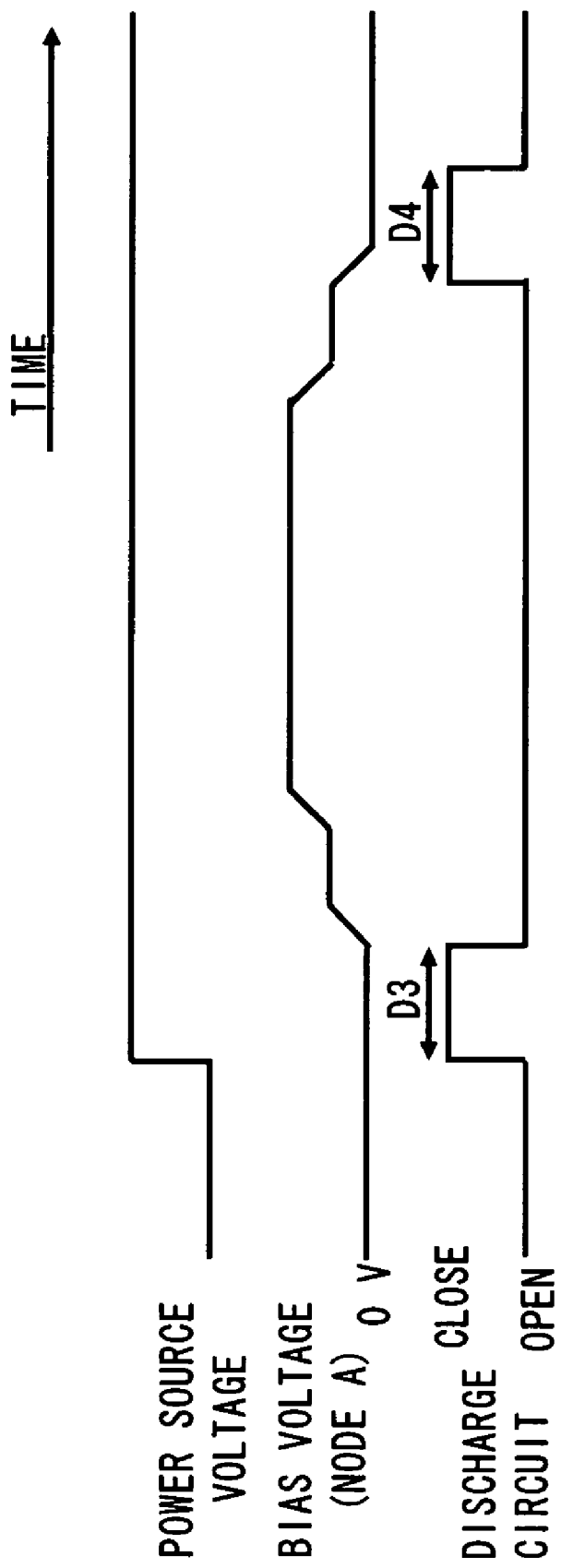
FIG. 18 is a view showing the operation of a capacitor microphone unit according to a seventh embodiment of the invention.

A seventh embodiment of the present invention is described herein with reference to the control timing chart of FIG. 18. The seventh embodiment is the same as the sixth embodiment in the circuit configuration. The seventh embodiment controls a discharger 1401 in rising and falling edges of a power supply voltage just like the first embodiment. Specifically, a controller (CPU) turns on the switch 1403 of the discharger 1401 at the rising and falling edges of a power supply voltage so that supply of a bias voltage to the capacitor microphone stops immediately.

It is thereby possible to prevent supply of a transitional overshoot voltage in the bias application to the capacitor microphone, thus suppressing noise. In this case also, a time to close the switch is set by the timer.

The setting time by the timer 1601, which is time D3 and D4, is preferably about time that transitional bias fluctuation occurs in voltage rise and drop. Though it is determined based on the characteristics of each power supply specifically, the time periods may be simply substantially the same for both voltage rise and drop. More simply, it is feasible to close the switch for about 1 to 100 μ-seconds just like the time periods D1 and D2 in the fifth embodiment. It is also feasible to make it the same as the time period D2 in the sixth embodiment, which is about 1 to 100 μseconds.

Eighth Embodiment

Figure 19:
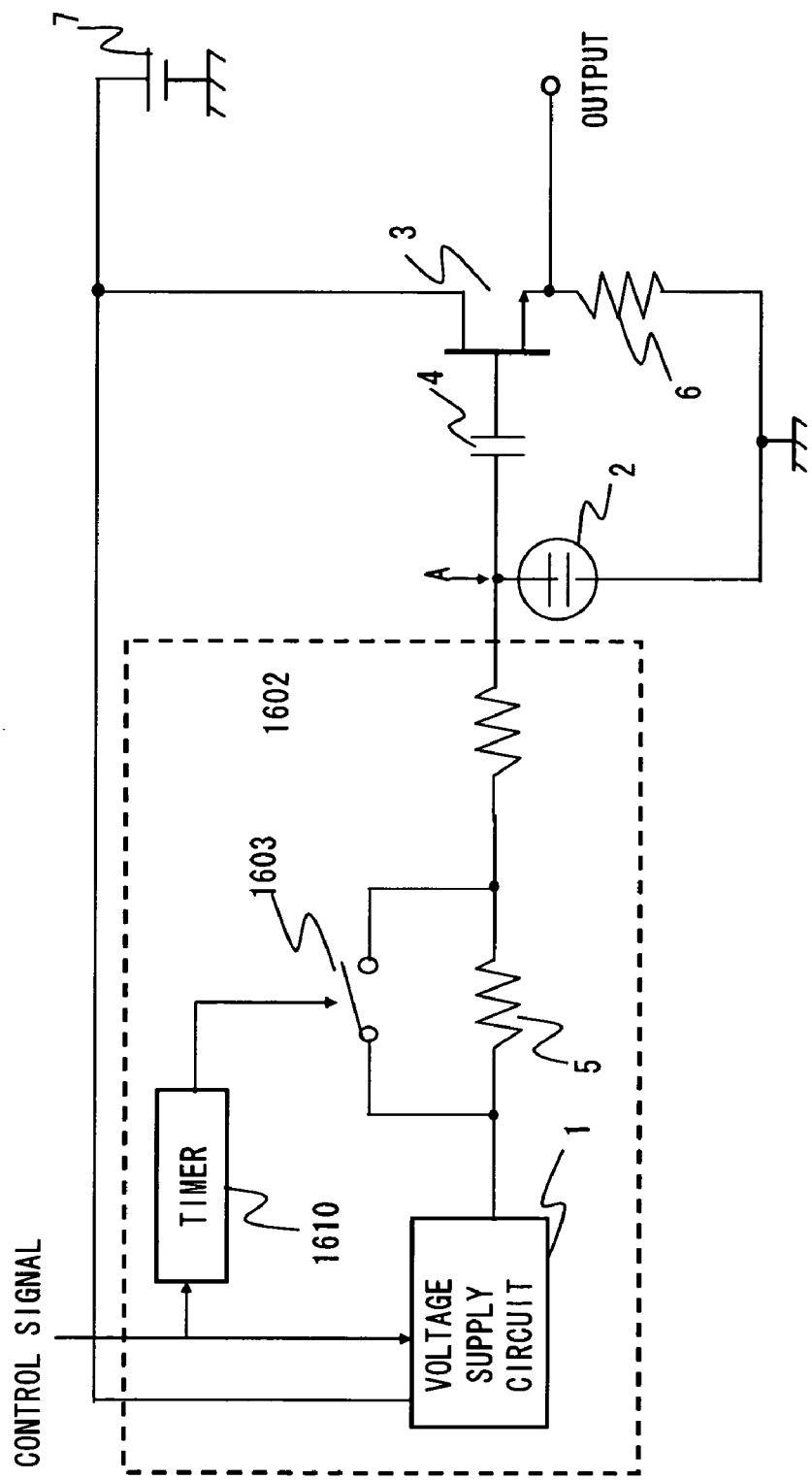
FIG. 19 is a view showing a capacitor microphone unit according to an eighth embodiment of the invention.
Figure 20:
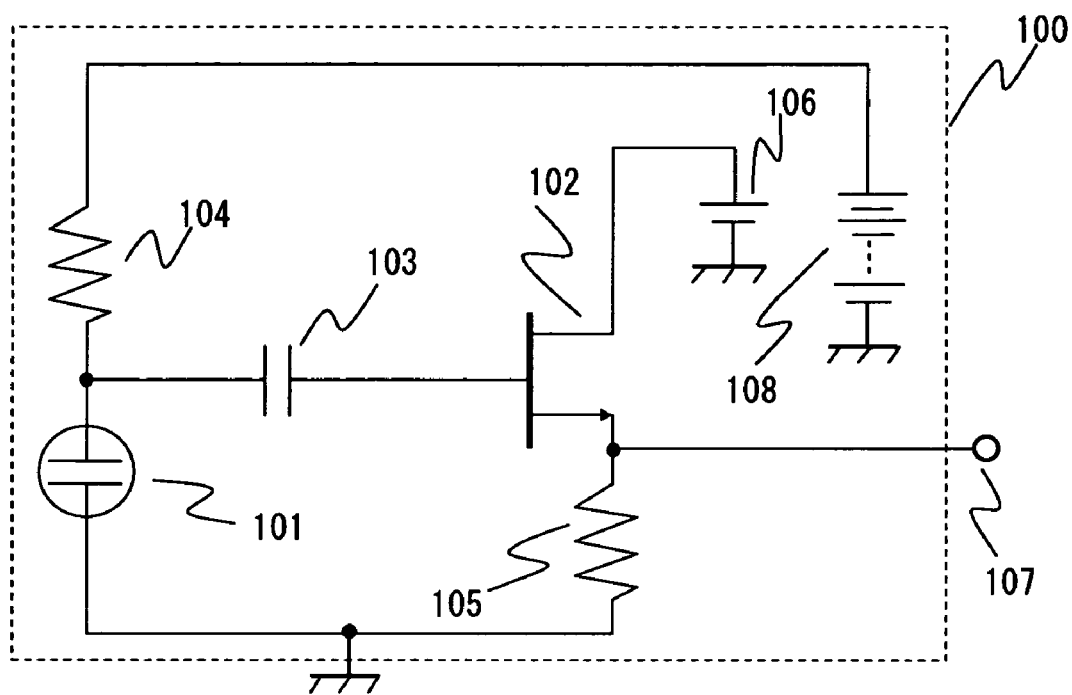
FIG. 20 is a view showing a conventional capacitor microphone unit.

An eighth embodiment of the preset invention is described herein with reference to FIG. 19. This embodiment uses a charge/discharge switch 1901 as rapid discharging means. The charge/discharge switch 1901 is connected to both ends of the high resistor 5 in parallel therewith. Since the output impedance of the voltage supply circuit 1 is normally as low as about 100 to 1000 kΩ, charging and discharging are performed in a short time if the high resistor 5 is bypassed by the switch 1901. Further, a resistor 1902 with a resistance value of about 100 to 1000 kΩ is placed between the high resistor 5 and an output terminal, which is not shown. The resistor 1902 may be eliminated.

Since this configuration applies a bias to the capacitor at low impedance, it substitutes the functions of the charger 1401 and the discharger 1601 so that as if it has both rapid discharging means and rapid charging means. In other words, the output of the bias power supply circuit has a push-pull configuration or a configuration allowing charge and discharge of a current for the bias of the capacitor microphone. Then, the switch 1901 is connected to the both ends of the high resistor, and in the switching of bias voltages, the switch is closed at once and then opened again according to a sensitivity switching signal from a controller such as CPU. Closing the switch 1901 bypasses the high resistor 3 to allow rapid voltage rise and drop.

As described in the foregoing, the voltage supply circuit of the present invention can apply an appropriate voltage according to a sensitivity level to a sensor such as a capacitor microphone. Further, it is possible to reduce sensitivity variation for each microphone unit such as a capacitor microphone unit. Furthermore, it is possible to suppress occurrence of noise by connecting a charger and a discharger.

The present invention is not restricted to the configurations described in the above embodiments but may be varied in many ways as described in the alternative embodiments.

For example, the sensitivity switching of the above described embodiments can be selected appropriately depending on a distance between a user and a microphone as described in the sixth embodiment. Further, though a low sensitivity mode and a high sensitivity mode are only described in the embodiments, a plurality of sensitivity modes of more than two can be applied to the embodiments of the present invention.

Further, though the case where the vibration sensor (capacitor microphone) is used as a sensor in the voltage supply circuit of the present invention is described in detail in the above embodiments, the application of the voltage supply circuit of the invention is not limited to the capacitor microphone. For example, it is effective for other sound pressure sensors that operate in the similar principle as the capacitor microphone and detect a change in capacitance, such as a one using a semiconductor device. Therefore, the microphone unit of the present invention also includes a one that uses another sound pressure sensor for detecting a change in capacitance, such as the one using a semiconductor device as a microphone. Furthermore, the voltage supply circuit of the present invention is considerably effective for a vibration sensor of a change detecting type, particularly a one that detects a change in capacitance. The voltage supply circuit of the present invention is also applicable to other sensors that can change the output by a DC bias voltage, such as a temperature sensor and an optical sensor.

It is apparent that the present invention is not limited to the above embodiment that may be modified and changed without departing from the scope and spirit of the invention.

What is claimed is:

1. A voltage supply circuit comprising:
   a power supply booster that boosts a voltage from a power supply;
   an amplifier operating with a voltage generated by the power supply booster as a boosted power supply voltage and supplying a bias voltage to a sensor; and
   an output voltage setting part including a feedback resistor for the amplifier, the feedback resistor having resistance determined according to a set value of a bias voltage of the sensor.

2. The voltage supply circuit according to claim 1, further comprising:
   a memory storing the set value of the bias voltage.

3. The voltage supply circuit according to claim 2, wherein the memory stores the set value of the bias voltage with a fuse.

4. The voltage supply circuit according to claim 2, wherein the memory stores the set value of the bias voltage with a zener-zap.

5. The voltage supply circuit according to claim 1, wherein the feedback resistor has resistance determined by a resistor selected arbitrarily from a plurality of resistors.

6. The voltage supply circuit according to claim 1, wherein the feedback resistor includes a plurality of resistors and determines resistance of the feedback resistor by using an arbitrary number of resistors corresponding to the set value of the bias voltage.

7. The voltage supply circuit according to claim 1, wherein the output voltage setting part further comprises:
a selector connected to the feedback resistor; and
a data processor supplying a selection signal to the selector, wherein the selector sets resistance of the feedback resistor according to the selection signal and serves as a feedback resistor for the amplifier.

8. The voltage supply circuit according to claim 1, wherein the feedback resistor at least includes a first feedback resistor and a second feedback resistor and one of the first feedback resistor and the second feedback resistor is selected as a feedback resistor for the amplifier according to a mode setting signal supplied from an outside of the output voltage setting part.

9. A microphone unit comprising:
a microphone receiving a bias voltage;
a power supply booster that boosts a voltage from a power supply;
an amplifier operating with a voltage generated by the power supply booster as a boosted power supply voltage and supplying a bias voltage to the microphone, which is connected on the output side of the amplifier; and
an output voltage setting part including a feedback resistor for the amplifier, the feedback resistor having resistance determined according to a set value of a bias voltage of the microphone.

10. The microphone unit according to claim 9, comprising:
a memory storing a set value of the bias voltage.

11. A power supply circuit supplying a bias voltage to a microphone unit including an amplifier, a capacitor and a capacitor microphone connected on an output side of the amplifier, the power supply circuit and microphone unit comprising:
a voltage supply circuit generating a predetermined bias voltage from a boosted voltage supplied from a voltage booster that boosts a voltage from a supply voltage, and supplying the bias voltage to the capacitor microphone connected on the output side of the amplifier through a resistor;
the resistor with one end connected to an output end of the voltage supply circuit; and
a discharger with one end connected to another end of the resistor and with another end connected to one of a ground terminal of the power supply circuit or the output end of the voltage supply circuit.

12. The power supply circuit according to claim 11, wherein the discharger is placed between another end of a high resistor and the ground terminal of the power supply circuit and includes a discharge resistor and a discharge switch.

13. The power supply circuit according to claim 12, comprising:
a timer causing the discharge switch to open and close, wherein the timer opens and closes the discharge switch for a predetermined time period in response to the sensitivity switching signal.

14. The power supply circuit according to claim 12, further comprising:
a charger connected in parallel between both ends of the resistor and including a charge switch and a charge resistor.

15. The power supply circuit according to claim 14, comprising:
a timer causing the charge switch to open and close, wherein the timer opens and closes the charge switch for a predetermined time period in response to the sensitivity switching signal.

16. The power supply circuit according to claim 12, further comprising:
a timer causing the discharge switch to open and close, wherein the timer opens and closes the discharge switch for a predetermined time period in response to a control signal from outside.

17. The power supply circuit according to claim 11, wherein the voltage supply circuit selectively outputs a plurality of bias voltages in response to a sensitivity switching signal from outside.

18. The power supply circuit according to claim 11, wherein the discharger connected to another end of a high resistor is a charge/discharge switch connected between both ends of the resistor.

19. The power supply circuit according to claim 18, wherein the voltage supply circuit selectively outputs a plurality of bias voltages in response to a sensitivity switching signal from outside, the voltage supply circuit comprises a timer causing the charge/discharge switch to open and close, and
the timer opens and closes the charge/discharge switch for a predetermined time period in response to the sensitivity switching signal.

20. The power supply circuit according to claim 11, wherein the power supply circuit is formed in one chip large-scale integrated circuit.

21. A microphone unit comprising the power supply circuit according to claim 11.

22. The power supply circuit according to claim 11, the voltage supply circuit comprising:
an amplifier operating with the boosted voltage generated by the power supply booster and supplying a bias voltage to a sensor; and
an output voltage setting part including a feedback resistor for the amplifier, the feedback resistor having resistance determined according to a set value of a bias voltage of the sensor.

23. The power supply circuit according to claim 11, the voltage supply circuit comprising:
an amplifier operating with the boosted voltage generated by the power supply booster and supplying a bias voltage to a sensor;
an output voltage setting part including a feedback resistor for the amplifier, the feedback resistor having resistance determined according to a set value of a bias voltage of the sensor; and
a memory storing the set value of the bias voltage.

24. The power supply circuit according to claim 11, the voltage supply circuit comprising:
an amplifier operating with a boosted voltage generated by the power supply booster and supplying a bias voltage to a sensor; and
an output voltage setting part including a feedback resistor for the amplifier, the feedback resistor having resistance determined according to a set value of a bias voltage;
wherein the feedback resistor at least includes a first feedback resistor and a second feedback resistor and one of the first feedback resistor and the second feedback resistor is selected as a feedback resistor for the amplifier according to a mode setting signal supplied from an outside of the output voltage setting part.

25. A method of adjusting a sensitivity of a microphone, comprising:

inputting a reference tone to a microphone connected to an output side of an amplifier;

comparing an output of the microphone for the reference tone with a reference voltage;

outputting a set value for setting a bias voltage to be biased to the microphone based on a comparison result; and storing the set value and determining a feedback resistance value of the amplifier for outputting the bias voltage based on the set value;

wherein the set value is based on a boosted voltage supplied by a voltage booster that boosts a voltage from a supply voltage.

* * * * *